(12) United States Patent
Park et al.

(10) Patent No.: US 12,543,380 B2
(45) Date of Patent: Feb. 3, 2026

(54) INTEGRATED CIRCUIT DEVICES INCLUDING STACKED TRANSISTORS AND METHODS OF FORMING THE SAME

(71) Applicant: Samsung Electronics Co., Ltd., Suwon-si (KR)

(72) Inventors: Keumseok Park, Slingerlands, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/595,486

(22) Filed: Mar. 5, 2024

(65) Prior Publication Data

US 2025/0107247 A1    Mar. 27, 2025

Related U.S. Application Data

(60) Provisional application No. 63/585,733, filed on Sep. 27, 2023.

(51) Int. Cl.
| | |
|---|---|
| *H10D 89/60* | (2025.01) |
| *H10D 30/01* | (2025.01) |
| *H10D 30/67* | (2025.01) |
| *H10D 62/10* | (2025.01) |
| *H10D 62/13* | (2025.01) |
| *H10D 84/85* | (2025.01) |

(52) U.S. Cl.
CPC ......... *H10D 89/811* (2025.01); *H10D 30/021* (2025.01); *H10D 30/6757* (2025.01); *H10D 62/10* (2025.01); *H10D 62/151* (2025.01); *H10D 84/85* (2025.01)

(58) Field of Classification Search
CPC ............... H01L 27/0266; H01L 27/092; H01L 29/0603; H01L 29/0847; H01L 29/66477; H01L 29/78696
See application file for complete search history.

(56) References Cited

U.S. PATENT DOCUMENTS

| | | | |
|---|---|---|---|
| 10,256,158 B1 * | 4/2019 | Frougier | .............. H10D 84/017 |
| 11,742,247 B2 | 8/2023 | Lin et al. | |
| 2021/0126135 A1 * | 4/2021 | Lee | ................... H01L 29/66545 |
| 2021/0202703 A1 * | 7/2021 | Rajashekhar | .......... H10B 43/27 |
| 2022/0020646 A1 * | 1/2022 | Lin | ...................... H01L 29/0847 |
| 2022/0157936 A1 | 5/2022 | Khaderbad et al. | |
| 2023/0065715 A1 | 3/2023 | Xie et al. | |
| 2023/0178440 A1 | 6/2023 | He et al. | |
| 2023/0253404 A1 | 8/2023 | Gardner et al. | |
| 2023/0307456 A1 | 9/2023 | Lin et al. | |

* cited by examiner

*Primary Examiner* — Norman D Richards
*Assistant Examiner* — Sean Ayers Winters
(74) *Attorney, Agent, or Firm* — Myers Bigel, P.A.

(57) ABSTRACT

A method of forming an integrated circuit device includes providing a stacked transistor structure on a substrate. The stacked transistor structure includes a first channel pattern of a first transistor and a second channel pattern of a second transistor stacked on the first channel pattern. Second source/drain regions of the second transistor are formed at opposing ends of the second channel pattern, and an oxidation process is performed to oxidize upper and lower surfaces of the second source/drain regions and side surfaces of the first channel. First source/drain regions of the first transistor are then formed at opposing ends of the first channel pattern. Related devices and fabrication methods are also discussed.

20 Claims, 13 Drawing Sheets

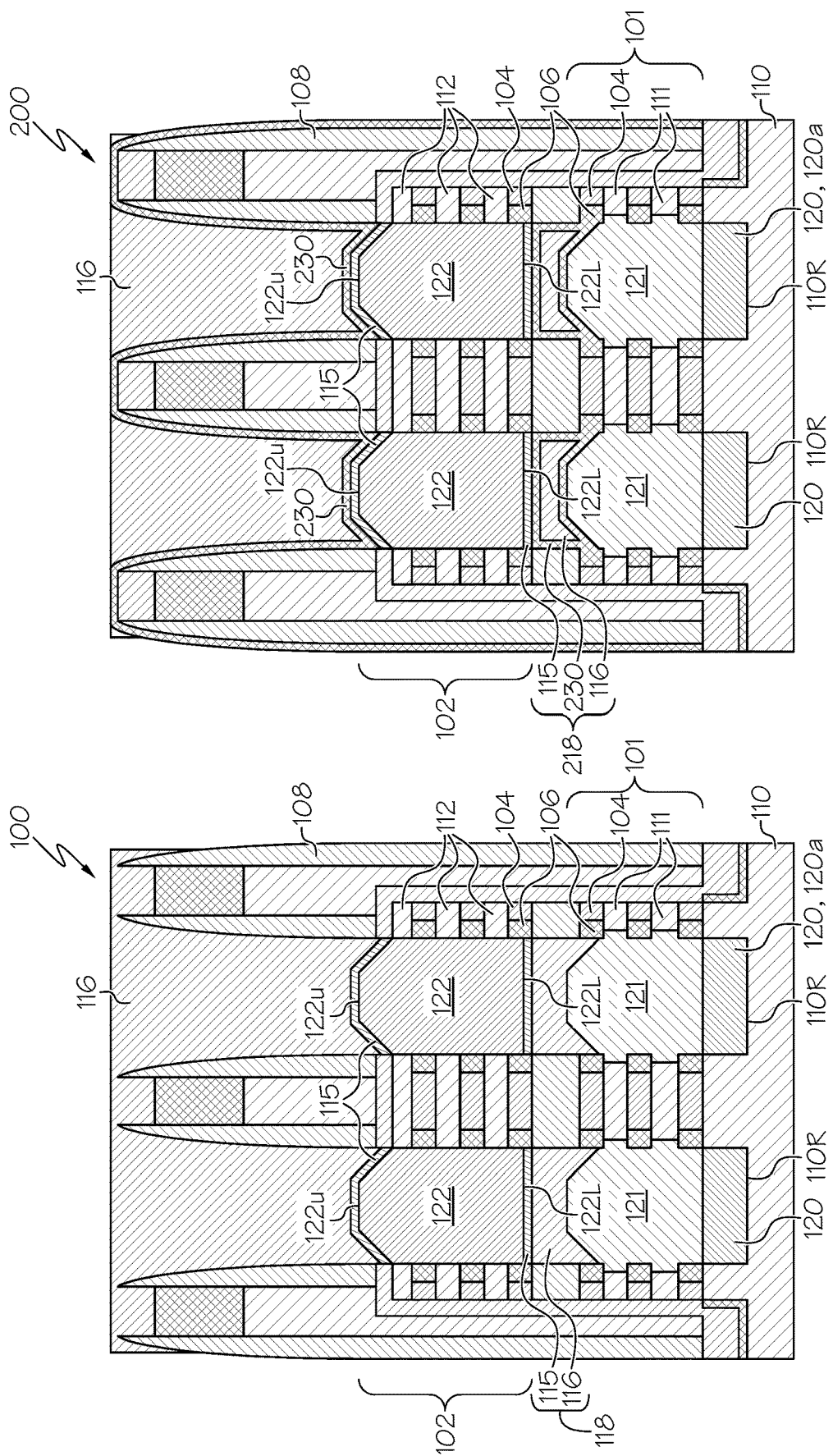

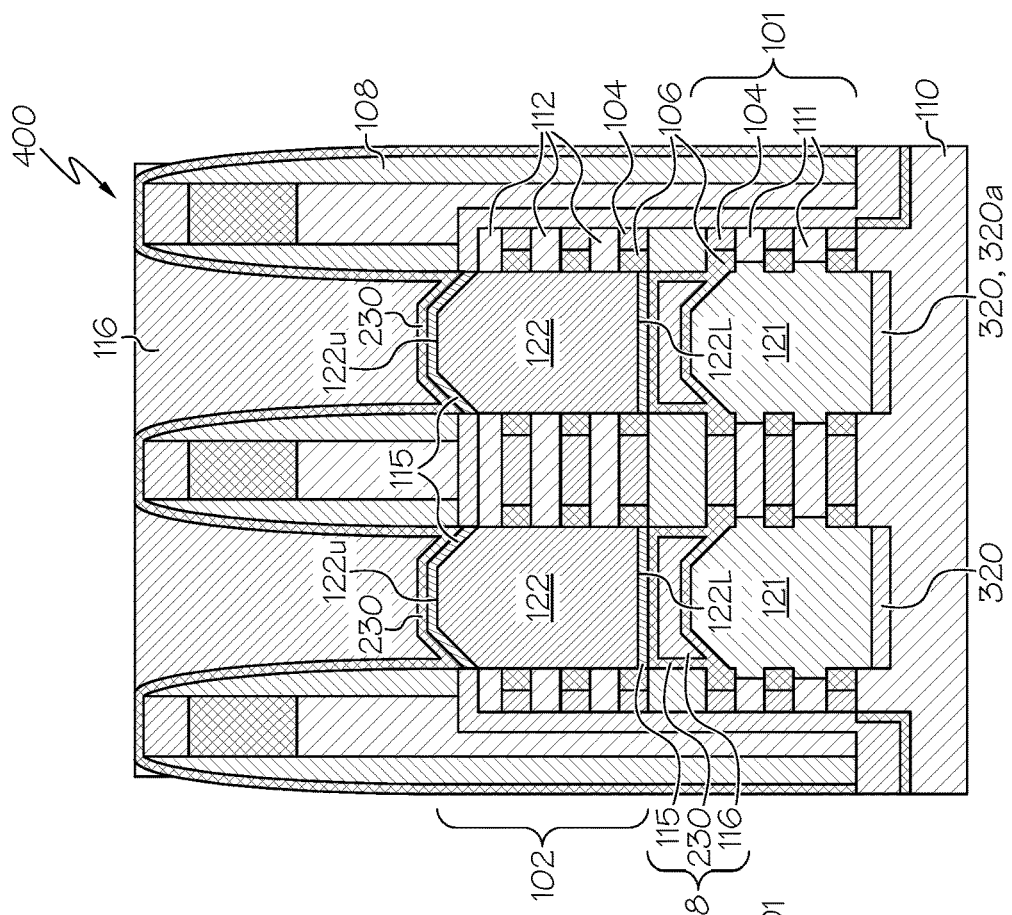
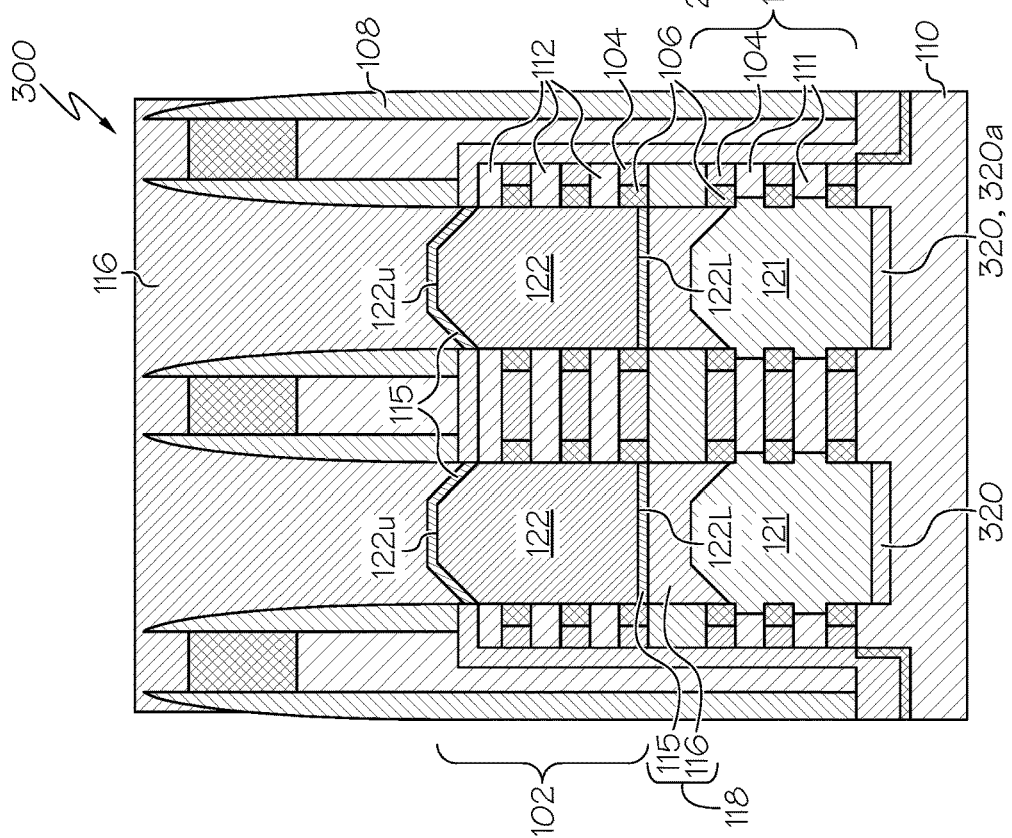
FIG. 3
FIG. 4

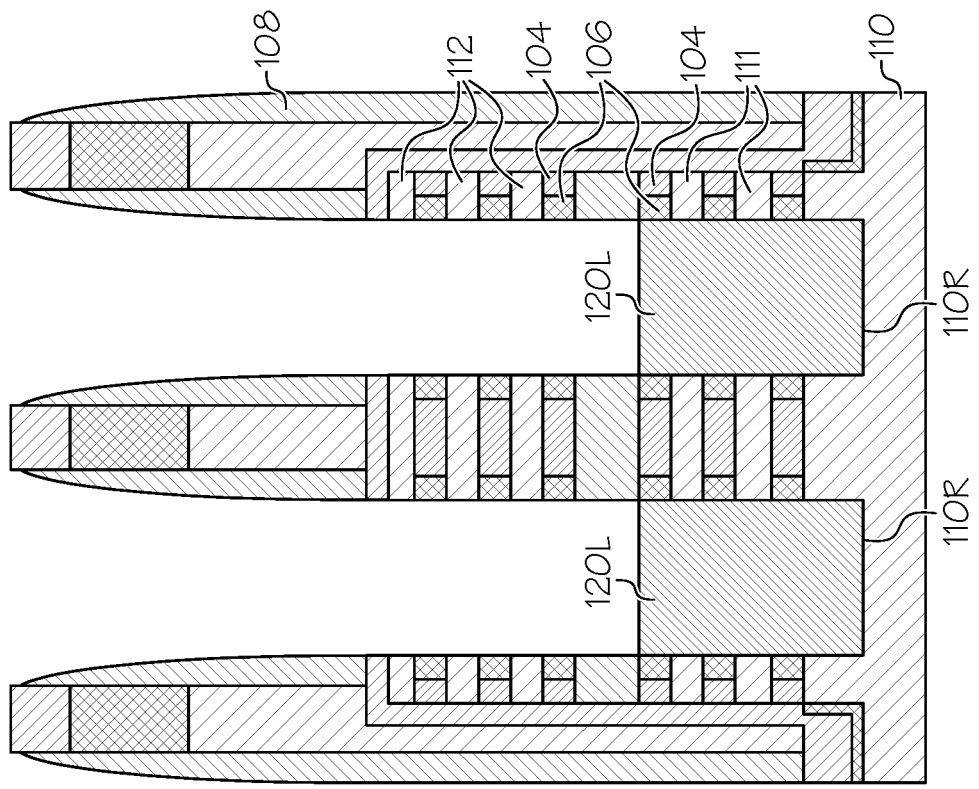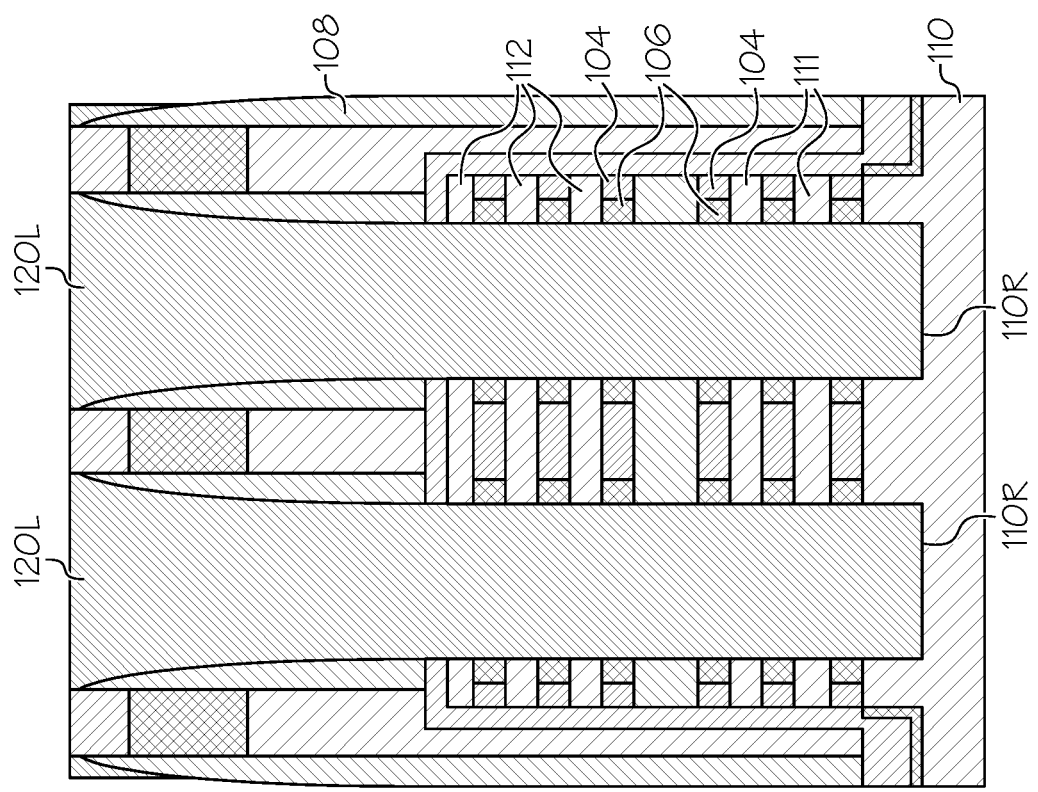

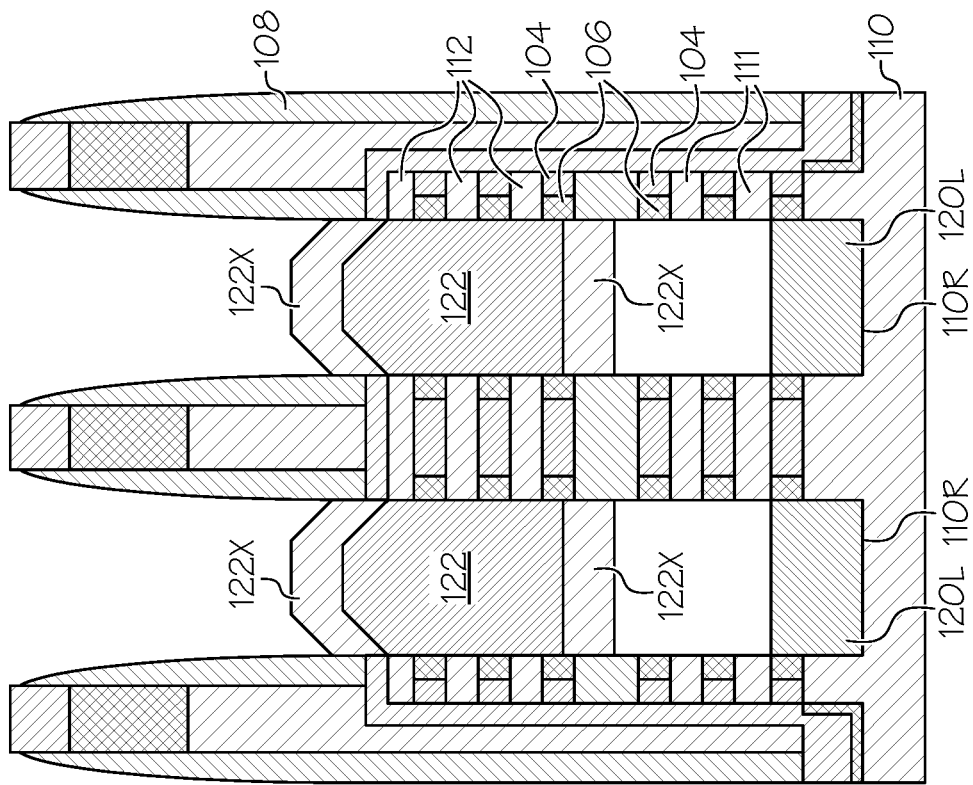
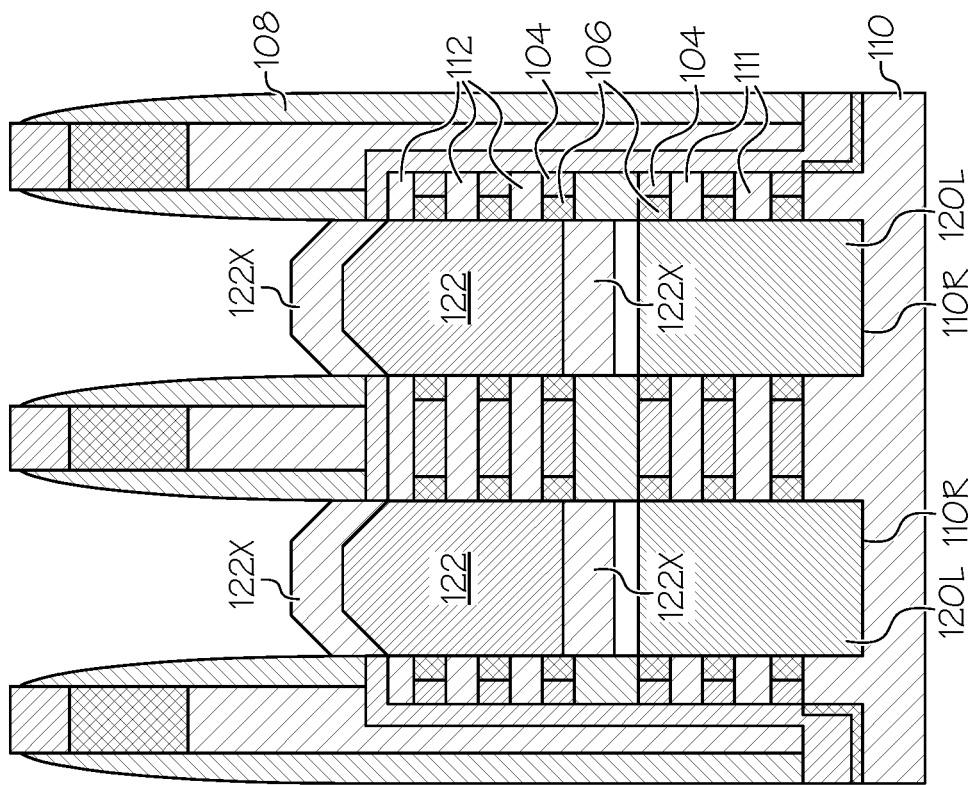
FIG. 5C
FIG. 5D

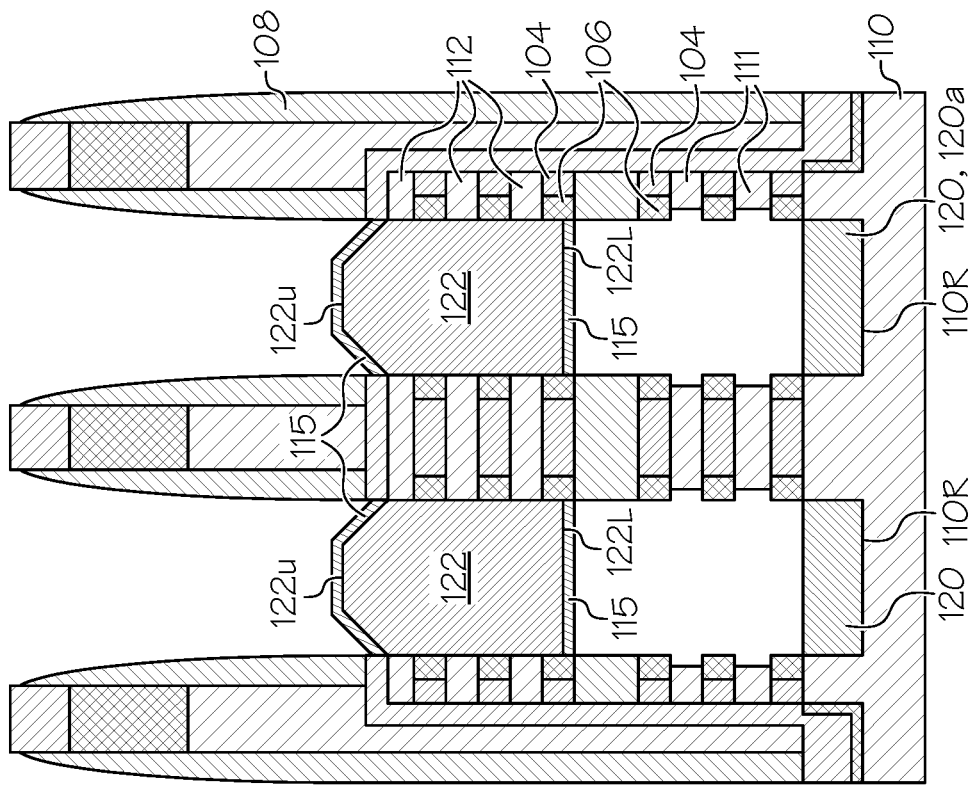
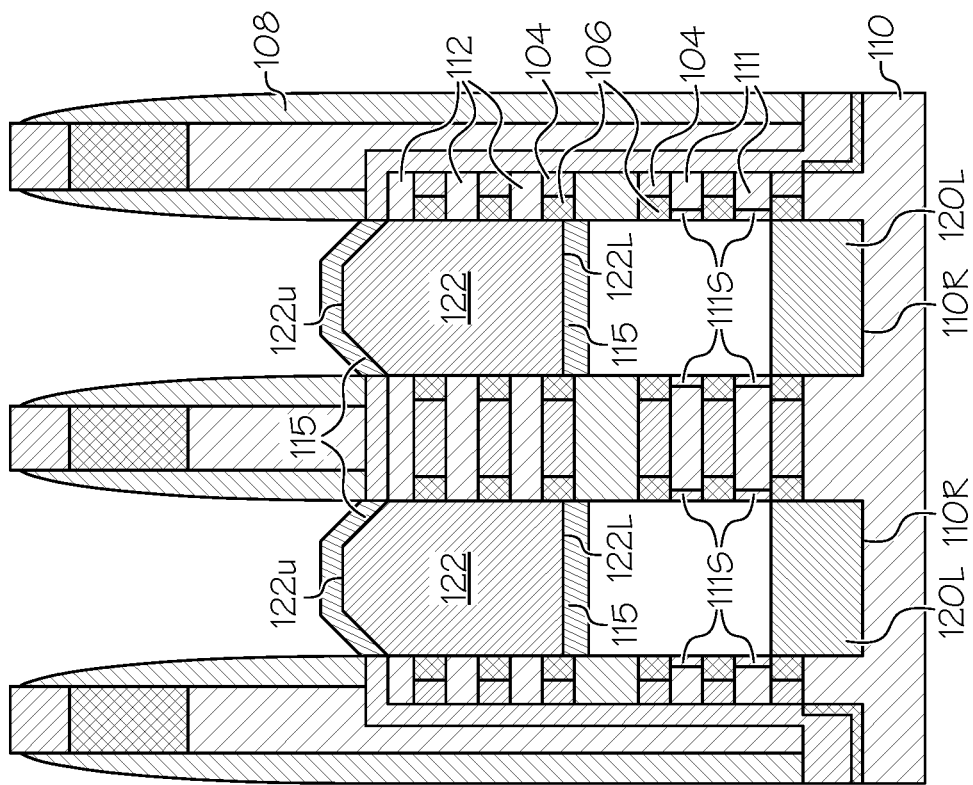
FIG. 5E
FIG. 5F

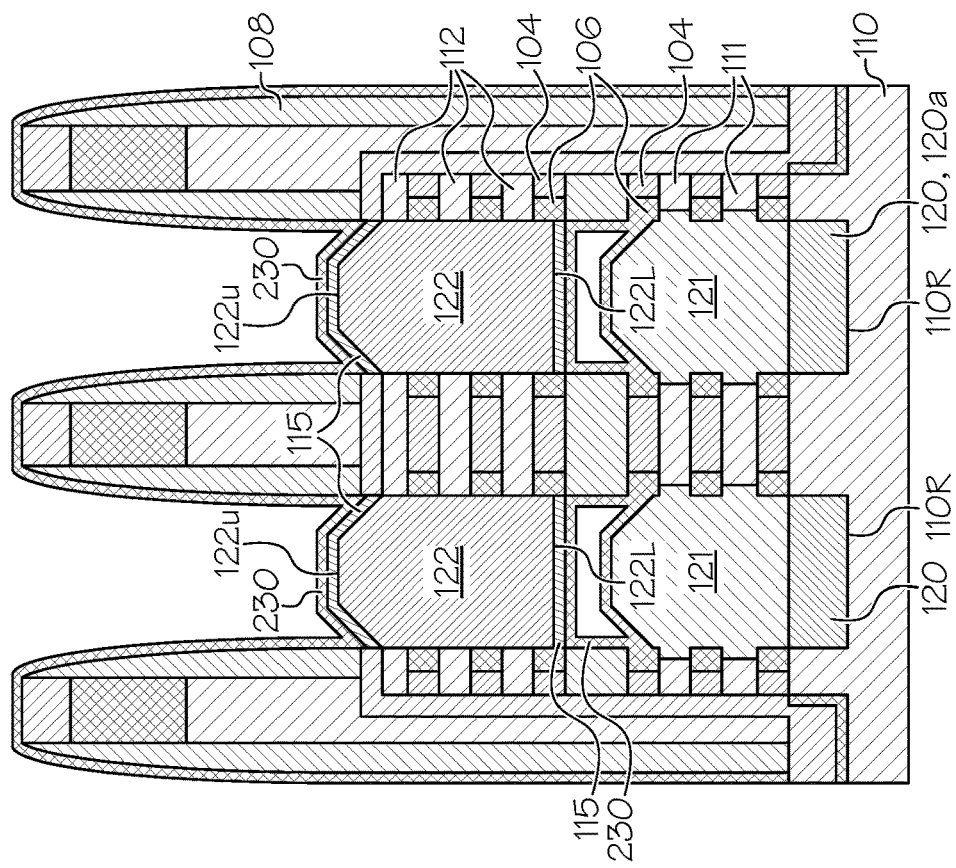
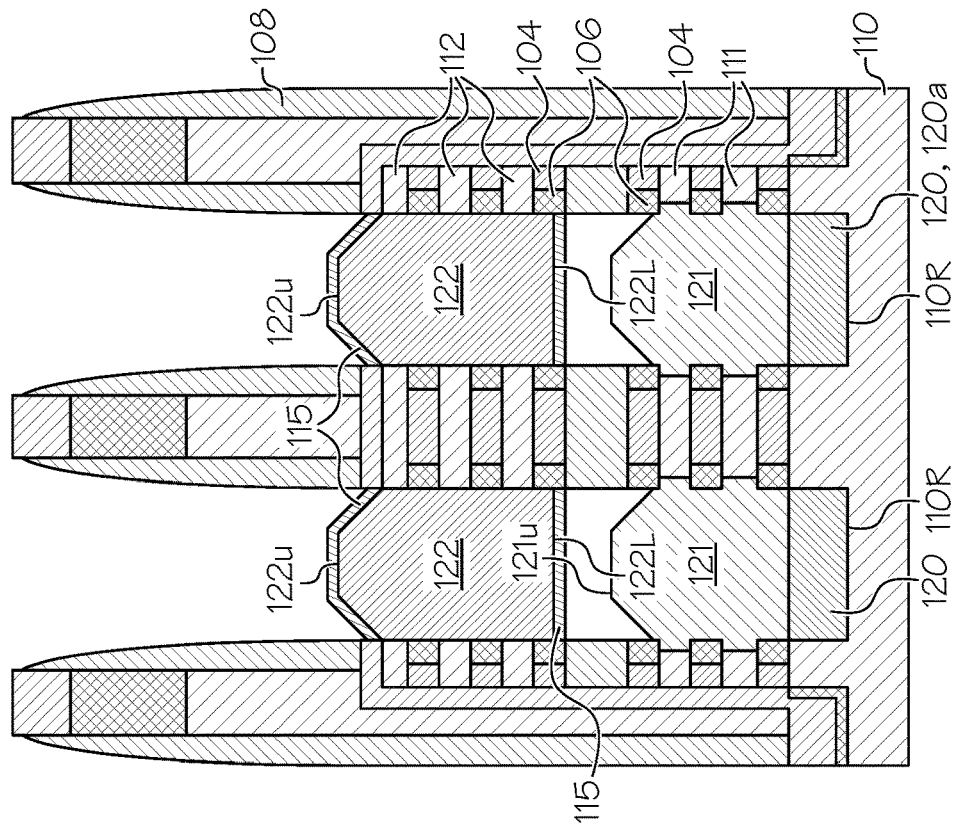

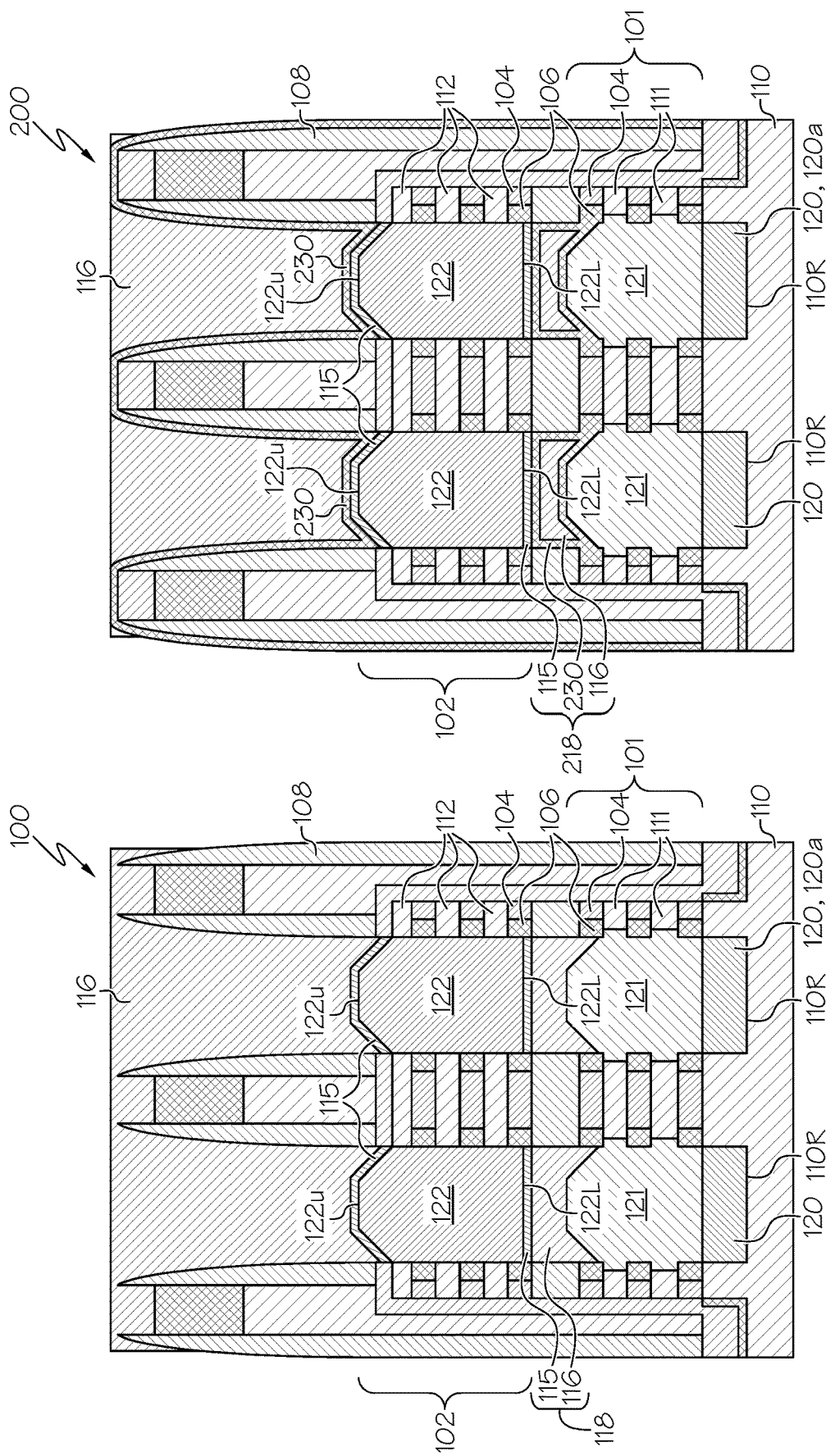

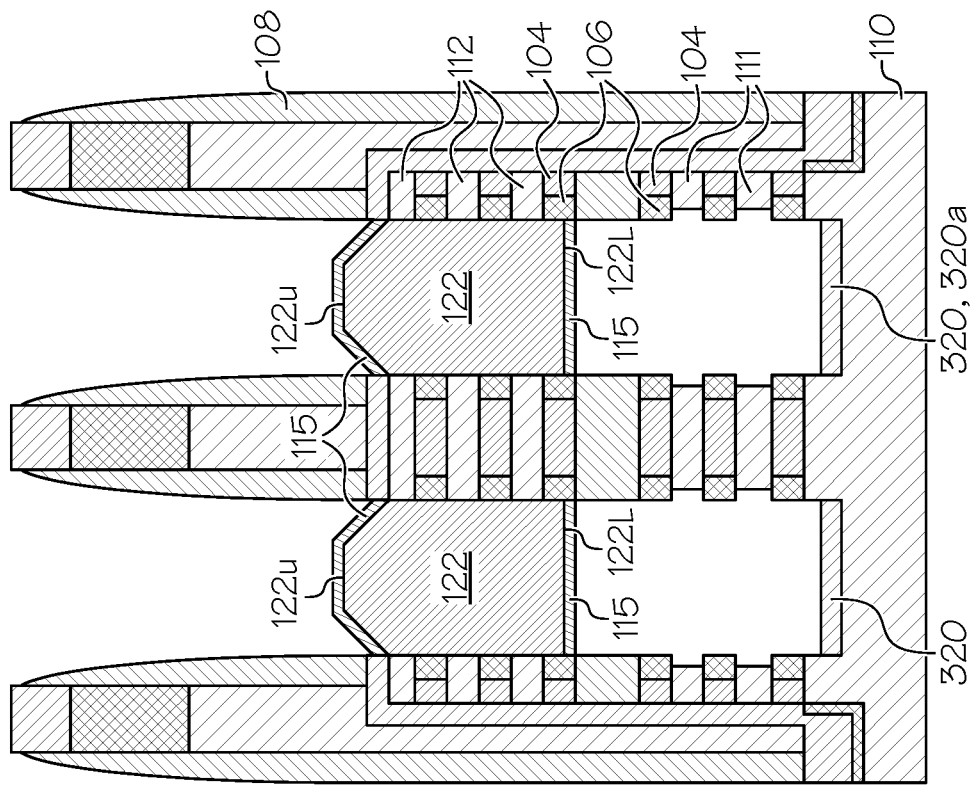
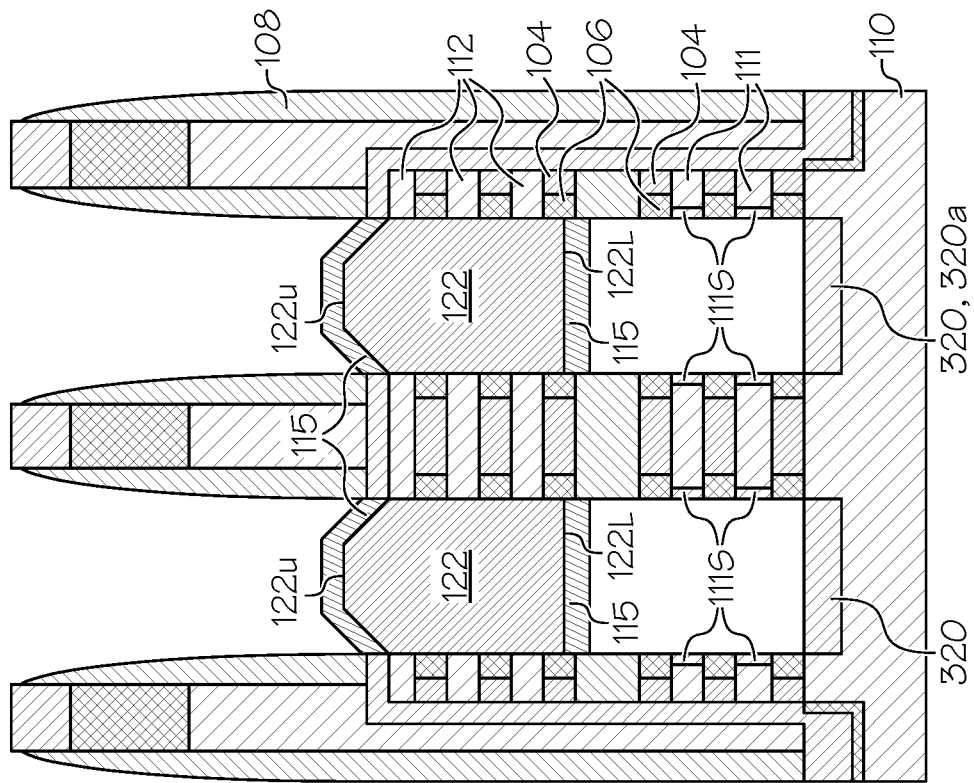

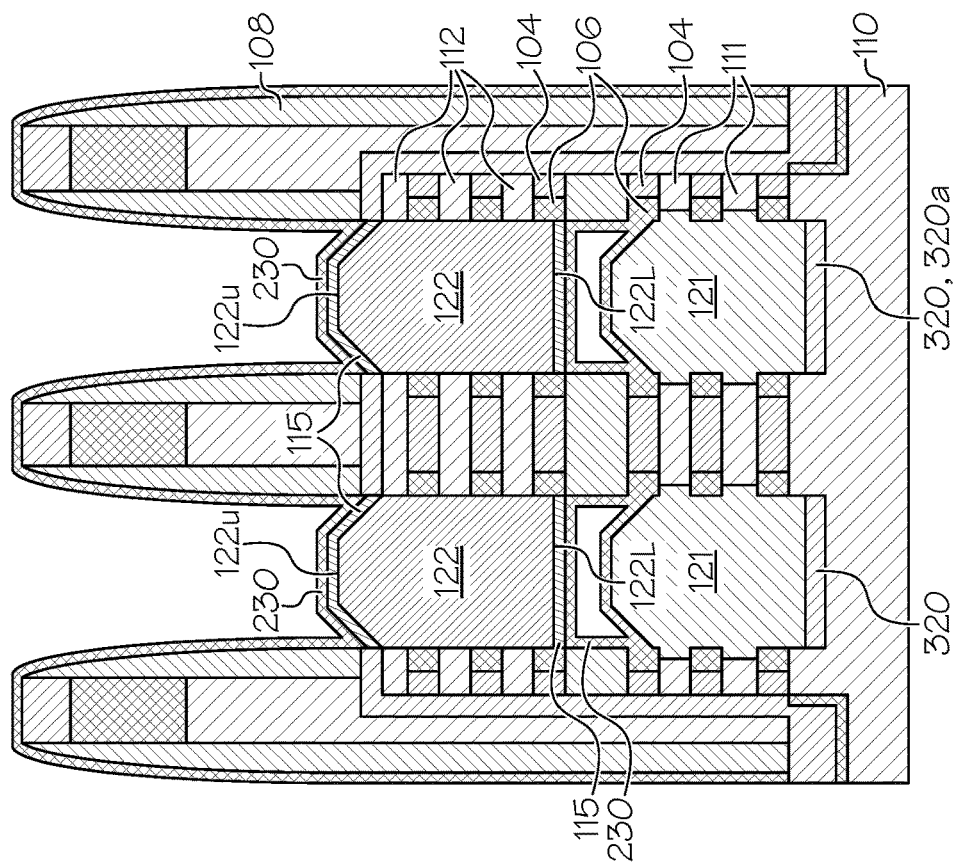
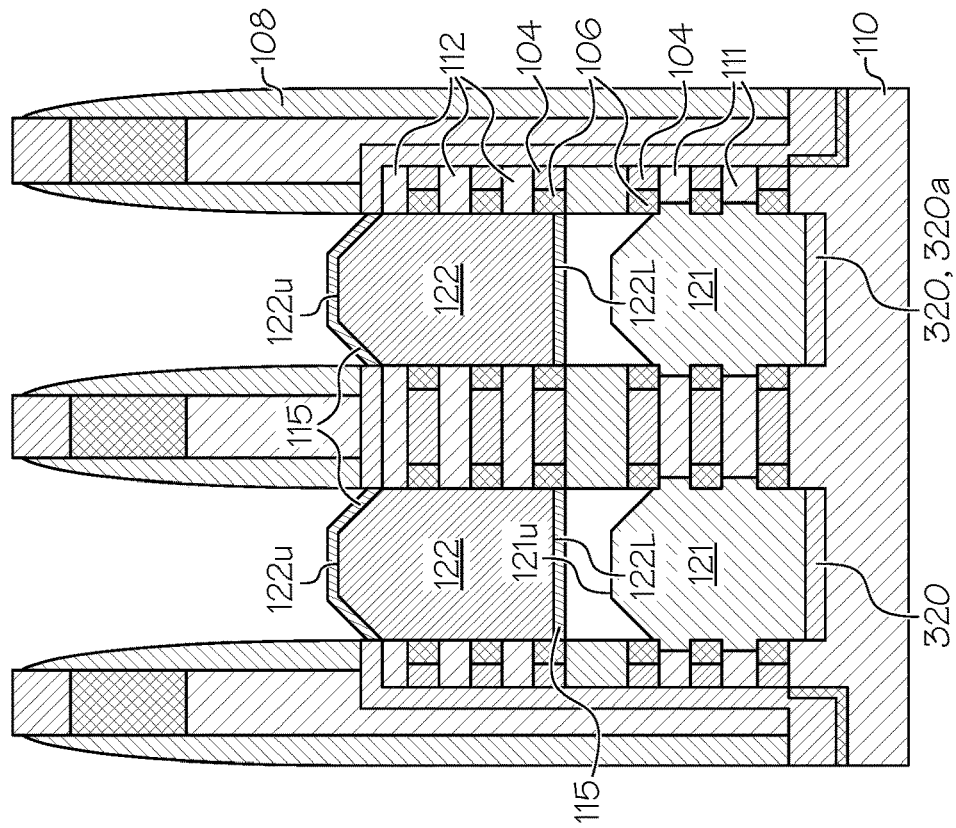

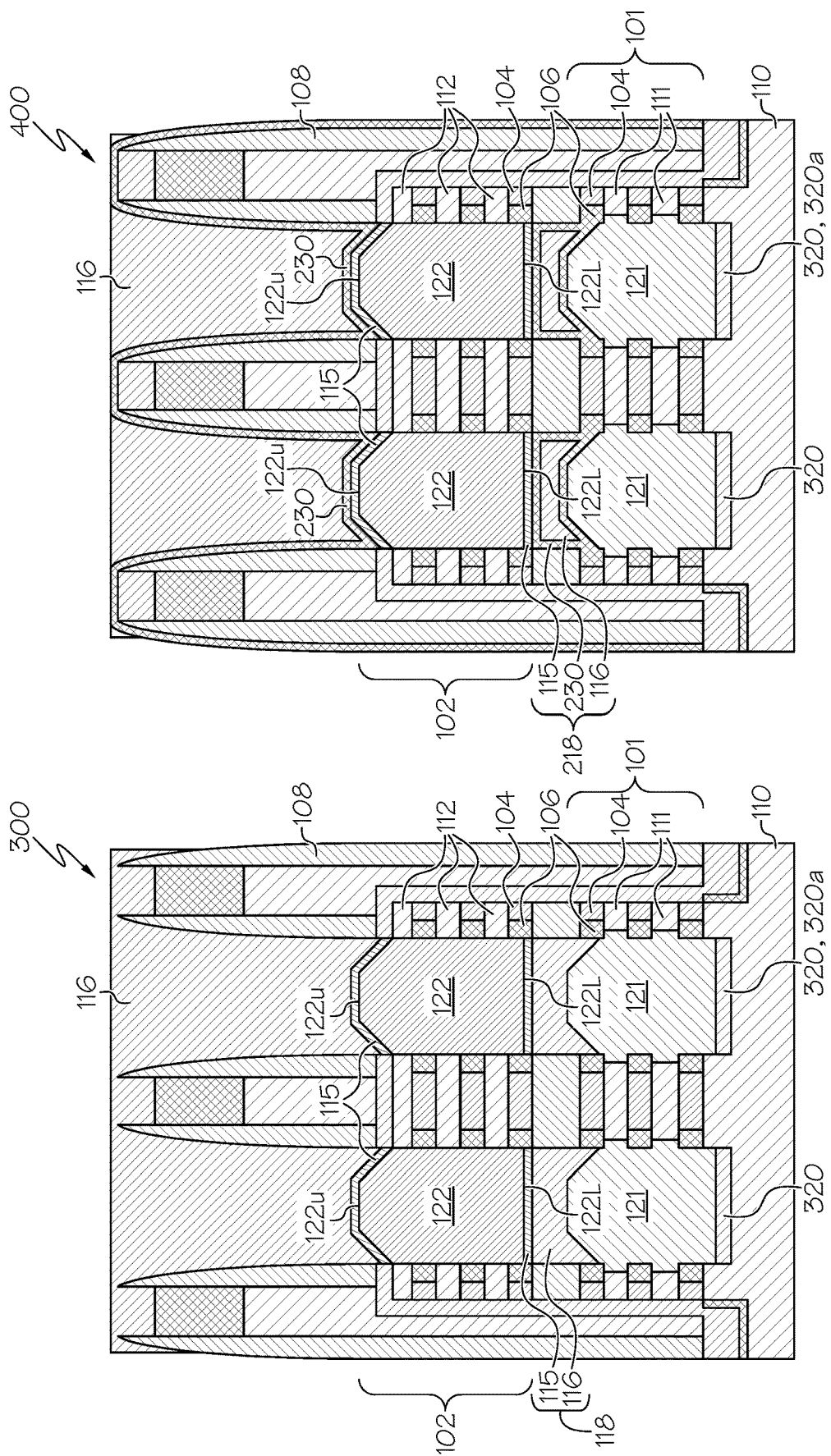

INTEGRATED CIRCUIT DEVICES INCLUDING STACKED TRANSISTORS AND METHODS OF FORMING THE SAME

CLAIM OF PRIORITY

This application claims priority from U.S. Provisional Patent Application Ser. No. 63/585,733 entitled "Integrated circuit devices including stacked transistors and methods of forming the same," filed Sep. 27, 2023, with the United States Patent and Trademark Office, the disclosure of which is incorporated by reference herein in its entirety.

FIELD

The present disclosure relates to integrated circuit devices.

BACKGROUND

Integrated circuit devices may utilize stacked transistors to increase density and improve performance. In some instances, the stacked transistors may be complementary to each other (e.g., complementary metal-oxide-semiconductor (CMOS) transistors). For example, a Complementary-FET (CFET) layout may include multiple vertically stacked pairs of gate-all-around field effect transistors (GAAFETs), with P-type GAAFETs on one-level, N-type GAAFETs on another level (i.e., above or below), and shared gates, where each shared gate extends between and wraps around the channel patterns of the stacked pair of N-type and P-type GAAFETs. In such structures, the source/drain regions of the lower GAAFET are electrically isolated from the source/drain regions of the upper GAAFET by dielectric layers.

As a distance or pitch (e.g., contact poly pitch (CPP)) between gates of the transistors is reduced to increase the density of the integrated circuit devices, it may be more difficult to electrically isolate the upper and lower stacked transistors. Thus, it may be difficult to fabricate CMOS transistors in a stacked arrangement with a relatively high or suitable aspect ratio (A/R).

SUMMARY

According to some embodiments, a method of forming an integrated circuit device includes providing a stacked transistor structure on a substrate, the stacked transistor structure comprising a first channel pattern of a first transistor and a second channel pattern of a second transistor stacked on the first channel pattern; forming second source/drain regions of the second transistor on opposing side surfaces of the second channel pattern; performing an oxidation process to oxidize portions of upper and lower surfaces of the second source/drain regions and opposing side surfaces of the first channel pattern to form first isolation patterns; and then forming first source/drain regions of the first transistor on the opposing side surfaces of the first channel pattern.

In some embodiments, the first source/drain regions are between the substrate and the portions of the lower surfaces of the second source/drain regions that were oxidized.

In some embodiments, forming the second source/drain regions includes forming an insulating layer on the opposing side surfaces of the first channel pattern; and epitaxially growing the second source/drain regions of the second transistor on the opposing side surfaces of the second channel pattern.

In some embodiments, the method further includes forming leakage protection regions comprising insulating patterns on the substrate adjacent the opposing side surfaces of the first channel pattern, where the first source drain/regions are formed on the leakage protection regions.

In some embodiments, forming the leakage protection regions includes recessing the substrate adjacent the opposing side surfaces of the first channel pattern to provide recessed surfaces; and forming the insulating patterns on the recessed surfaces of the substrate adjacent the opposing side surfaces of the first channel pattern. The insulating layer may be formed on the recessed surfaces of the substrate and on the opposing ends of the first channel pattern prior to forming the second source/drain regions, and may be recessed or otherwise reduced in thickness after forming the second source/drain regions to form the insulating patterns in some embodiments.

In some embodiments, forming the leakage protection regions includes performing the oxidation process to form the insulating patterns on surfaces of the substrate adjacent the opposing side surfaces of the first channel pattern.

In some embodiments, forming the first source/drain regions includes removing the side surfaces of the first channel pattern that were oxidized to expose the opposing ends of the first channel patterns; and then epitaxially growing the first source/drain regions of the first transistor at the opposing ends of the first channel pattern.

In some embodiments, the method further includes forming second or additional isolation patterns between the first isolation patterns and upper surfaces of the first source/drain regions, where the first isolation patterns and the second isolation patterns form a device isolation pattern that provides electrical isolation between the first and second source/drain regions.

In some embodiments, prior to forming the second isolation pattern, the method further includes forming epitaxial blocking liner layers on the upper and lower surfaces of the second source/drain regions that were oxidized to form the first isolation patterns. The first isolation patterns, the epitaxial blocking liner layers on the lower surfaces of the second source/drain regions, and the second isolation patterns form a device isolation pattern that provides electrical isolation between the first and second source/drain regions.

In some embodiments, the first source/drain regions comprise a same material composition as the first channel pattern and the substrate.

In some embodiments, the second source/drain regions comprise a different material composition than the first source/drain regions.

In some embodiments, the first source/drain regions are of a first conductivity type, and the second source/drain regions are of a second conductivity type that is opposite to the first conductivity type.

In some embodiments, the second channel pattern comprises silicon, and responsive to performing the oxidation process, silicon portions are provided between the upper and lower surfaces of the second source/drain regions that were oxidized.

In some embodiments, forming the first and second source drain regions is performed without forming blocking spacers on the opposing ends of the second channel pattern, and where the first and second channel patterns have a same channel length.

According to some embodiments, a method of forming an integrated circuit device includes providing a stacked transistor structure directly on a substrate, the stacked transistor structure comprising a first channel pattern of a first transistor and a second channel pattern of a second transistor stacked on the first channel pattern; forming second source/drain regions of the second transistor at opposing ends of the second channel pattern; forming leakage protection regions comprising insulating patterns on the substrate adjacent the opposing ends of the first channel pattern; and then forming first source/drain regions of the first transistor at opposing ends of the first channel pattern, where the first source/drain regions are between the second source/drain regions and the leakage protection regions.

In some embodiments, forming the second source/drain regions includes forming an insulating layer on the opposing side surfaces of the first channel pattern; and epitaxially growing the second source/drain regions of the second transistor on the opposing side surfaces of the second channel pattern.

In some embodiments, forming the leakage protection regions includes recessing the substrate adjacent the opposing ends of the first channel pattern to provide recessed surfaces; forming an insulating layer on the recessed surfaces of the substrate and on opposing ends of the first channel pattern prior to forming the second source/drain regions; and reducing a thickness of the insulating layer to provide the insulating pattern after forming the second source/drain regions.

In some embodiments, the method further includes performing an oxidation process to oxidize upper and lower surfaces of the second source/drain regions and side surfaces of the first channel pattern, prior to forming the first source/drain regions. Forming the first source/drain regions may include removing the side surfaces of the first channel pattern that were oxidized to expose the opposing ends of the first channel pattern; and then epitaxially growing the first source/drain regions of the first transistor at the opposing ends of the first channel pattern.

In some embodiments, forming the leakage protection regions may include performing the oxidation process to form the insulating patterns on surfaces of the substrate adjacent the opposing ends of the first channel pattern.

In some embodiments, the oxidized lower surfaces of the second source/drain regions may provide first isolation patterns, and the method may further include forming second isolation patterns between the first isolation patterns and upper surfaces of the first source/drain regions, where the first isolation patterns and the second isolation patterns form device isolation patterns that electrically isolates the first source/drain regions from the second source/drain regions.

In some embodiments, the method may further include forming epitaxial blocking liner layers on the oxidized upper and lower surfaces of the second source/drain regions, where the first isolation patterns, the epitaxial blocking liner layers on the lower surfaces of the second source/drain regions, and the second isolation patterns form device isolation patterns that electrically isolate the first source/drain regions from the second source/drain regions.

According to some embodiments, an integrated circuit device includes a stacked transistor structure directly on a substrate, the stacked transistor structure comprising a first channel pattern of a first transistor and a second channel pattern of a second transistor stacked on the first channel pattern; first source/drain regions of the first transistor at opposing ends of the first channel pattern; second source/drain regions of the second transistor at opposing ends of the second channel pattern; and leakage protection regions comprising insulating patterns on the substrate adjacent the opposing ends of the first channel pattern, where the first source/drain regions are between the second source/drain regions and the leakage protection regions.

In some embodiments, the substrate may include recessed surfaces adjacent the opposing ends of the first channel pattern, and the insulating patterns at least partially fill the recessed surfaces of the substrate adjacent the opposing ends of the first channel pattern.

In some embodiments, the insulating patterns may be oxidized surfaces of the substrate adjacent the opposing ends of the first channel pattern.

In some embodiments, the second source/drain regions may include oxidized upper and lower surfaces, the oxidized lower surfaces of the second source/drain regions may provide first isolation patterns. The integrated circuit device may further include second or additional isolation patterns between the first isolation patterns and upper surfaces of the first source/drain regions, where the first isolation patterns and the second isolation patterns electrically isolate the first source/drain regions from the second source/drain regions.

In some embodiments, epitaxial blocking liner layers are provided on the oxidized upper and lower surfaces of the second source/drain regions. The first isolation patterns, the epitaxial blocking liner layers on the oxidized lower surfaces of the second source/drain regions, and the second isolation patterns form device isolation patterns that electrically isolate the first source/drain regions from the second source/drain regions.

In some embodiments, the first source/drain regions and the first and second channel patterns comprise silicon, the second source/drain regions comprise a different material than the first source/drain regions, and silicon portions are provided between the oxidized upper and lower surfaces of the second source/drain regions.

According to some embodiments, an integrated circuit device includes a stacked transistor structure on a substrate, the stacked transistor structure comprising a first channel pattern of a first transistor and a second channel pattern of a second transistor stacked on the first channel pattern; first source/drain regions of the first transistor at opposing ends of the first channel pattern; and second source/drain regions of the second transistor at opposing ends of the second channel pattern, where the second source/drain regions comprise oxidized upper and lower surfaces; and epitaxial blocking liner layers on the oxidized upper and lower surfaces of the second source/drain regions.

In some embodiments, the oxidized lower surfaces of the second source/drain regions provide first isolation patterns, and the integrated circuit device may further include second or additional isolation patterns between the first isolation patterns and upper surfaces of the first source/drain regions, where the first isolation patterns, the epitaxial blocking liner layers on the lower surfaces of the second source/drain regions, and the second isolation patterns electrically isolate the first source/drain regions from the second source/drain regions.

In some embodiments, the integrated circuit device further includes leakage protection regions comprising insulating patterns on the substrate adjacent the opposing ends of the first channel pattern, where the first source/drain regions are between the second source/drain regions and the leakage protection regions.

In some embodiments, the first source/drain regions and the first and second channel patterns may include silicon, the second source/drain regions may include a different material than the first source/drain regions, and silicon portions may be provided between the oxidized upper and lower surfaces of the second source/drain regions.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 1, 2, 3, and 4 are schematic cross-sectional views illustrating various configurations of semiconductor integrated circuit devices according to some embodiments of the present disclosure.

FIGS. 5A, 5B, 5C, 5D, 5E, 5F, 5G1, 5G2, 5H1, and 5H2 are schematic cross-sectional views illustrating methods of fabricating semiconductor integrated circuit devices according to some embodiments of the present disclosure.

FIGS. 6A, 6B, 6C, 6D, 6E, 6F, 6G1, 6G2, 6H1, and 6H2 are schematic cross-sectional views illustrating methods of fabricating semiconductor integrated circuit devices according to further embodiments of the present disclosure.

DETAILED DESCRIPTION OF EMBODIMENTS

Figure 6A:
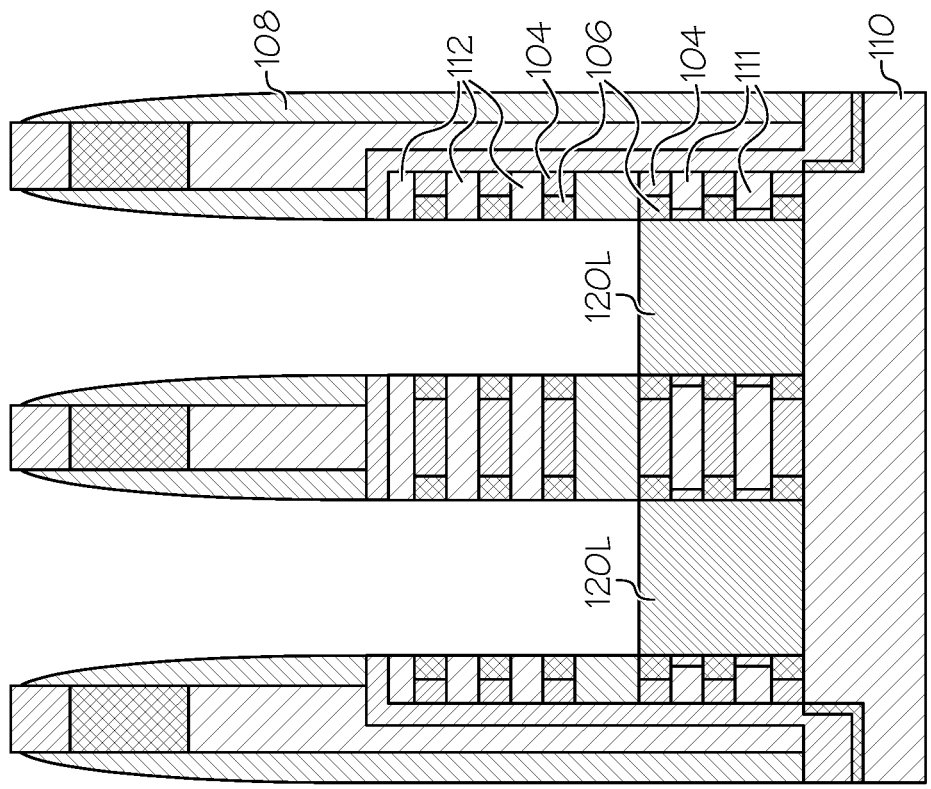

In embodiments described herein, a stacked transistor structure may include a first transistor and a second transistor. The first transistor may be a first type of transistor (e.g., a n-type metal-oxide-semiconductor (NMOS) transistor) and the second transistor may be a second type of transistor (e.g., a p-type metal-oxide-semiconductor (PMOS) transistor). The first and second types of transistors may be complementary to each other (e.g., CMOS transistors), and in some embodiments the stacked transistor may be or may include a stack of CMOS transistors. The first and second transistors may be stacked in any order (e.g., with the first transistor on top of the second transistor, or the second transistor on top of the first transistor), resulting in a stack comprising a top device (also referred to herein as an upper device or upper transistor, relative to an underlying substrate) and a bottom device (also referred to herein as a lower device or lower transistor, relative to the underlying substrate).

Some embodiments of the present disclosure may arise from realization that as CPP between transistor gates decreases, isolation between upper and lower devices (e.g., for CMOS configurations) in stacked arrangements with high A/R may become more difficult. Also, control of source/drain leakage current may become more important in stacked arrangements with high A/R.

Embodiments of the present disclosure provide integrated circuit devices having stacked transistor structures (such as a CPP 3D stacked FET in a CMOS configuration) with relatively high A/R. Some embodiments achieve electrical isolation between upper and lower devices of the stacked transistor structures using oxidation processes (e.g., plasma oxidation or thermal oxidation), and in particular embodiments, oxidation of (i) sidewalls of the channel patterns of the lower devices and (ii) the outermost layers or surfaces of the source/drain regions of the upper devices. For example, after growing an upper epitaxial layer for the upper source/drain regions (e.g., having a boron-doped silicon (B: Si) layer at the outermost part or at upper and lower surfaces), oxidation may be performed on the channel patterns of the lower devices and on surfaces (e.g., upper and/or lower surfaces) of the source/drain regions of the upper devices (e.g., the upper epitaxial layers), and then the lower device source/drain regions (e.g., the lower epitaxial layers) may be grown to fabricate a CMOS transistor.

Embodiments of the present disclosure may thereby form upper and lower device isolation patterns by oxidation of outermost layers or surfaces of the upper device source/drain regions. Embodiments of the present disclosure may further form leakage protection areas in the stacked transistor structure, for example, by forming lower device source/drain regions over a recess in the substrate that is at least partially filled with an oxide or other insulating pattern). In some embodiments, CMOS devices can be created from relatively small CPP 3D stacked FET with high A/R through oxidation of the outermost surfaces of an Si layer of upper device source/drain regions, while creating a leakage protection area. As such, embodiments of the present disclosure may prevent electrical contact between the top transistor (e.g., the upper S/D) and the bottom transistor (e.g., the lower S/D) in a stacked transistor structure, even as CPP is reduced.

FIG. 1 is a cross-sectional view illustrating an example configuration of a semiconductor integrated circuit device 100 according to some embodiments of the present disclosure. As shown in FIG. 1, an integrated circuit device includes a stacked transistor structure 105 including first and second transistors 101, 102 vertically stacked on a substrate 110. The first transistor 101 includes at least one first channel pattern 111 between conductive gate patterns 104. The second transistor 102 includes at least one second channel pattern 112 between gate patterns 104. In the example of FIG. 1, multiple second channel patterns 112 are stacked on multiple first channel patterns 111, with the gate patterns 104 alternatingly stacked between the channel patterns 111, 112, but embodiments of the present disclosure may include fewer or more channel patterns than shown. The channel patterns may be provided by semiconductor materials, such as silicon (Si). The stacked transistor structure 105 may further include inner spacers 108 (e.g., formed of insulating or dielectric materials, for example, SiOCN or other low-k dielectric material), and additional semiconductor (e.g., Si) and insulator (e.g., SiN, SiO) layers stacked on the channel patterns.

First source/drain regions 121 of the first transistor 101 are provided on opposing sides (also referred to herein as opposing ends) of the first channel patterns 111, and second source/drain regions 122 of the second transistor 102 are provided on opposing sides or ends of the second channel patterns 112. Gate insulating patterns 106 (e.g., silicon nitride patterns) may be provided on opposing sides of the gate patterns 104 to electrically insulate the gate patterns 104 from the first and second source/drain regions 121 and 122. In some embodiments, the first source/drain regions 121 may include a same material or material composition as the first channel pattern and the substrate 110. For example, the first channel patterns 111 and the first source/drain regions 121 may be implemented as silicon layers. In some embodiments, the second source/drain regions 122 may include a different material or material composition than the first source/drain regions 121. For example, the second channel patterns 112 may be implemented as silicon germanium (SiGe) layers.

In the example of FIG. 1, the first (lower) transistors 101 and second (upper) transistors 102 have complementary conductivity types, e.g., to provide a CMOS device. In particular, the first transistors 101 may have a first conductivity type (e.g., n-type), while the second transistors 102 may have a second conductivity type (e.g., p-type) that is opposite to the first conductivity type, or vice versa. That is, stacked transistor structures 105 according to embodiments of the present disclosure are not limited to particular orientations of transistors having the different conductivity types. Moreover, the first and second transistors 101 and 102 may have the same conductivity type (e.g., both the first and second transistors 101 and 102 may be n-type, or both the first and second transistors 101 and 102 may be p-type) in some embodiments. Also, while illustrated with reference to first and second transistors 101 and 102, it will be understood that stacked transistor structures 105 according to embodiments of the present disclosure are not limited to two-transistor arrangement, and may include additional transistors (e.g., third transistors, fourth transistors, etc.) that are vertically stacked on the substrate 110.

Still referring to FIG. 1, upper and lower surfaces 122U and 122L of the second source/drain regions 122 include insulating (e.g., oxidized) portions that provide first isolation patterns 115 between the first source/drain regions 121 and the second source/drain regions 122. For example, as described in greater detail below with reference to FIGS. 5A to 5H2 and FIGS. 6A to 6H2, one or more oxidation processes (such as plasma oxidation or thermal oxidation) may be performed on exposed upper 122U and/or lower surfaces 122L of the second source/drain regions 122 such that oxide layers are formed, also referred to herein as oxidized portions or surfaces of the second source/drain regions 122. In some embodiments, portions of the second source/drain regions 122 may not be fully oxidized, such that non-oxidized semiconductor (e.g., silicon) portions 122X remain or are otherwise provided between the upper and lower surfaces 122U and 122L of the second source/drain regions 122 and the oxidized portions thereof that provide the first isolation patterns 115.

Second isolation patterns 116 may be provided on the first isolation patterns 115 (e.g., on the oxidized upper and lower surfaces 122U and 122L of the second source/drain regions 122). The first and second isolation patterns 115 and 116 between the second source/drain regions 122 and the first source/drain regions 121 collectively define device isolation patterns 118 that provide electrical isolation between the first and second transistors 101 and 102. In particular, the oxidized lower surfaces 122L of the second source/drain regions 122 that provide the first isolation patterns 115 and the second isolation patterns 116 may define device isolation patterns 118 that provide electrical isolation between the lower surfaces 122L of the second source/drain regions 122 and upper surfaces 121U of the first source/drain regions 121. The device isolation patterns 118 including the first isolation patterns 115 and second isolation patterns 116 as described herein may effectively provide electrical isolation between the first and second transistors 101 and 102 even as CPP is reduced and/or A/R is increased.

As also shown in FIG. 1, leakage protection regions 120 are provided on the substrate 110 adjacent the opposing sides of the first channel pattern, such that the first source/drain regions 121 are between the second source/drain regions 122 and the leakage protection regions 120. The leakage protection regions 120 may be implemented by insulating patterns 120a formed in or on the substrate 110. For example, in some embodiments as described in greater detail below with reference to FIGS. 5A to 5H2, the substrate 110 may include recessed surfaces 110R adjacent the opposing sides 113 of the first channel patterns 111, and the insulating patterns 120a at least partially fill the recessed surfaces 110R to provide the leakage protection regions 120. In some embodiments, the insulating patterns 120a may be oxide-based (e.g., silicon oxide) patterns. In some embodiments, the insulating patterns 120a may be nitride-based (e.g., silicon nitride) patterns. Other insulating materials (e.g., $SiO_2$, SiON, SiOCN, SiBCN, SiCN, etc.) may also be used as the insulating patterns 120a, such that the leakage protection regions 120 may be the same material or may be a different material than the first and second isolation patterns 115 and 116. The leakage protection regions 120 are thereby provided between the first source/drain regions 121 and the substrate 110.

FIG. 2 is a cross-sectional view illustrating an example configuration of a semiconductor integrated circuit device 200 according to some embodiments of the present disclosure. As shown in FIG. 2, an integrated circuit device 200 includes a similar stacked transistor structure 105 as described above with reference to the integrated circuit device 100 of FIG. 1, including first channel patterns 111 of a first transistor 101 and second channel patterns 112 of a second transistor 102 stacked on the first channel pattern, first source/drain regions 121 of the first transistor 101 on opposing sides of the first channel pattern, and second source/drain regions 122 of the second transistor 102 on opposing sides of the second channel pattern. Upper and lower surfaces 122U and 122L of the second source/drain regions 122 include insulating (e.g., oxidized) portions or layers thereon that provide first isolation patterns 115. In some embodiments, non-oxidized semiconductor portions 122X of the second source/drain regions 122 may remain or may otherwise be provided between the upper and lower surfaces 122U and 122L of the second source/drain regions 122 and the oxidized portions thereof that provide the first isolation patterns 115. Second isolation patterns 116 are provided between the lower surfaces 122L of the second source/drain regions 122 and upper surfaces 121U of the first source/drain regions 121.

In addition, FIG. 2 further illustrates that one or more blocking liner layers 230 are provided on the first isolation patterns 115 (e.g., the oxidized portions) on the upper and lower surfaces 122U and 122L of the second source/drain regions 122. The blocking liner layers 230 may be configured to prevent epitaxial growth, and may also be referred to herein as epitaxial blocking liner layers 230 or epi blocking liners 230. The epi blocking liners 230 formed on the upper and lower surfaces 122U and 122L of the second source/drain regions 122 may have the same thickness, or may have different thicknesses. The epi blocking liners 230 may provide further separation and electrical isolation between the first and second transistors 101 and 102 in the stacked transistor structure 105. As such, the first isolation patterns 115 on lower surfaces 122L of the second source/drain regions 122, the epitaxial blocking liner layers 230, and the second isolation patterns 116 collectively define device isolation patterns 218 that provide electrical isolation between the first and second source/drain regions 121 and 122. In some embodiments, the epi blocking liners 230 may have a thickness of about 4 nm or less, which may be sufficient to provide electrical isolation between the first and second transistors 101 and 102 without substantially increasing capacitance.

The blocking liner layers 230 may include a different material than the first and second isolation patterns 115 and 116 in some embodiments. For example, where the first and second isolation patterns 115 and 116 are formed as oxide layers, the epi blocking liners 230 may be formed as nitride layers. The oxidized lower surfaces 122L of the second source/drain regions 122 that provide the first isolation patterns 115, the nitride epitaxial blocking liner layers 230, and the second isolation pattern may thereby define an oxide-nitride-oxide (ONO) structure that provides electrical isolation between the first and second source/drain regions 121 and 122.

As in the integrated circuit device 100 of FIG. 1, the integrated circuit device 200 further includes leakage protection regions 120 provided by insulating patterns 120a on the substrate 110 adjacent the opposing sides of the first channel pattern and between the first source/drain regions 121 and the substrate 110. The leakage protection regions 120 may be formed of the same material or a different material than the first and second isolation patterns 115, 116 and/or the epitaxial blocking liner layers 230. For example, in some embodiments, the leakage protection regions 120 may be oxide-based (e.g., SiO) patterns. In some embodiments, the leakage protection regions 120 may be nitride-based (e.g., SiN) patterns.

FIG. 3 is a cross-sectional view illustrating an example configuration of a semiconductor integrated circuit device 300 according to some embodiments of the present disclosure. As shown in FIG. 3, an integrated circuit device 300 includes a similar stacked transistor structure 105 as described above with reference to the integrated circuit device 100 of FIG. 1, including first channel patterns 111 of a first transistor 101 and second channel patterns 112 of a second transistor 102 stacked on the first channel patterns 111, first source/drain regions 121 of the first transistor 101 on opposing sides of the first channel patterns 111, and second source/drain regions 122 of the second transistor 102 on opposing sides of the second channel pattern. Upper and lower surfaces 122U and 122L of the second source/drain regions 122 include insulating (e.g., oxidized) portions that provide first isolation patterns 115. In some embodiments, non-oxidized semiconductor portions 122X of the second source/drain regions 122 may remain or may otherwise be provided between the upper and lower surfaces 122U and 122L of the second source/drain regions 122 and the oxidized portions thereof that provide the first isolation patterns 115. Second isolation patterns 116 are provided between the lower surfaces 122L of the second source/drain regions 122 and upper surfaces 121U of the first source/drain regions 121. The combination of the second isolation patterns 116 and the oxidized lower surfaces 122L of the second source/drain regions 122 that define the first isolation patterns 115 form a device isolation pattern that provides electrical isolation between the first and second source/drain regions 121 and 122, as in the embodiment of FIG. 1.

In addition, the integrated circuit device 300 includes leakage protection regions 320 provided by insulating patterns 320a on the substrate 110 adjacent the opposing sides of the first channel pattern, where the leakage protection regions 320 are between the first source/drain regions 121 and the substrate 110. The integrated circuit device 300 of FIG. 3 may differ from the integrated circuit device 100 of FIG. 1 in implementation of the leakage protection regions 320. In particular, the insulating patterns 320a that provide the leakage protection regions 320 may be formed on surfaces of the substrate 110 adjacent the opposing sides of the first channel pattern, for instance, by one or more oxidation processes. For example, as described in greater detail below with reference to FIGS. 6A to 6H2, the insulating patterns 320a may be oxide patterns formed by oxidizing surfaces of the substrate 110 adjacent the opposing sides of the first channel pattern. In some embodiments, the insulating patterns 320a defining the leakage protection regions 320 may be formed during the same oxidation process used to oxidize the upper and lower surfaces 122U and 122L of the second source/drain regions 122 to provide the first isolation patterns 115.

FIG. 4 is a cross-sectional view illustrating an example configuration of a semiconductor integrated circuit device 400 according to some embodiments of the present disclosure. As shown in FIG. 4, an integrated circuit device 400 includes a similar stacked transistor structure 105 as described above with reference to the integrated circuit device 300 of FIG. 3. In addition, FIG. 4 further illustrates that one or more epitaxial blocking liner layers 230 are provided on the first isolation patterns 115 (e.g., the oxidized portions) on the upper and lower surfaces 122U and 122L of the second source/drain regions 122, similar to the integrated circuit device 200 of FIG. 2. As such, the combination of the first isolation patterns 115 on the lower surfaces 122L of the second source/drain regions 122, the epitaxial blocking liner layers 230, and the second isolation patterns 116 collectively define device isolation patterns 218 that provide electrical isolation between the first and second source/drain regions 121 and 122.

The epitaxial blocking liner layers 230 may include a different material (e.g., nitride) than the first and second isolation patterns 115 and 116 (e.g., oxide) in some embodiments. For example, as discussed above with reference to the embodiment of FIG. 2, the oxidized lower surfaces 122L of the second source/drain regions 122 that provide the first isolation patterns 115, the epitaxial blocking liner layers 230, and the second isolation patterns 116 define an oxide-nitride-oxide (ONO) structure that provides electrical isolation between the first and second source/drain regions 121 and 122. In some embodiments, the epi blocking liners 230 may have a thickness of about 4 nm or less, which may be sufficient to provide electrical isolation between the first and second transistors 101 and 102 without substantially increasing capacitance.

As such, embodiments of the present disclosure may allow for improved fabrication of device isolation patterns 118, 218 between the source/drain regions of upper and lower transistors 101, 102 (with or without epitaxial blocking liner layers 230), and/or leakage protection regions 120, 320 between the source/drain regions of the lower transistors and the substrate 110 in a stacked transistor structure 105. In some embodiments, the source/drain regions of the upper transistors may be formed prior to forming the source/drain regions of the lower transistors in the stacked structure, as described in greater detail below with reference to FIGS. 5A to 5H2 and 6A to 6H2. However, embodiments of the present disclosure are not limited to such a fabrication order. For example, in embodiments where the upper and lower transistors have complimentary conductivity types (e.g., CMOS devices), first source/drain regions 121 that include the same material as the first channel patterns 111 may be epitaxially grown from ends of the first channel patterns 111 after fabricating second source/drain regions 122 that include a different material than the second channel patterns 112 (such that oxidized surfaces of the first channel patterns 111 may be re-grown during formation of the first source/drain regions 121), regardless of the relative positions of the first and second source/drain regions 121 and 122 in the stacked structure, such that fabrication operations for forming blocking spacers on side surfaces of the channel patterns 111, 112 during growth of the source/drain regions may be omitted.

FIGS. 5A, 5B, 5C, 5D, 5E, 5F, 5G1, 5G2, 5H1, and 5H2 are schematic cross-sectional views illustrating methods of fabricating semiconductor integrated circuit devices according to some embodiments of the present disclosure. The methods of FIGS. 5A to 5H2 are described below with reference to FIG. 7, which is a flowchart 700 illustrating methods of fabricating semiconductor integrated circuit devices according to some embodiments of the present disclosure.

Figure 7:
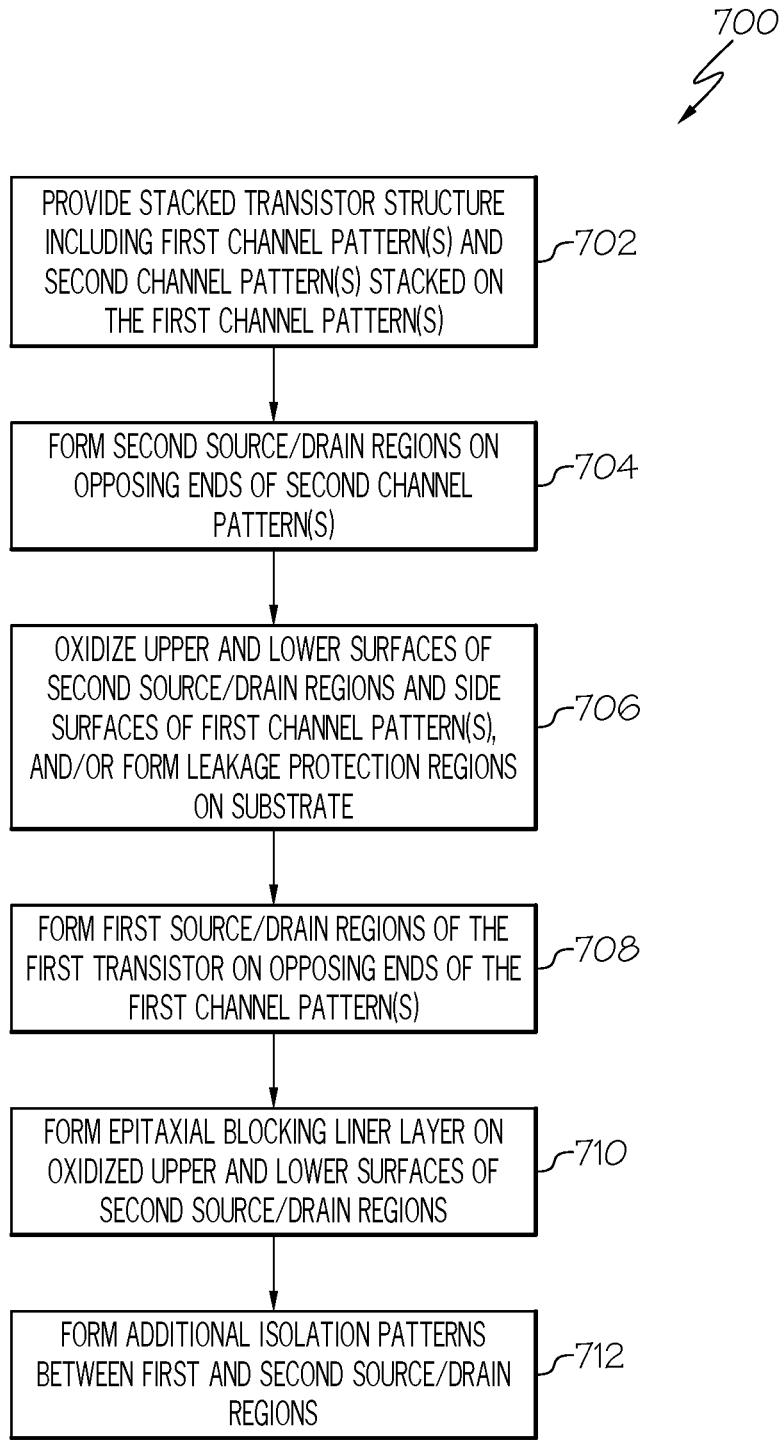
FIG. 7 is a flowchart illustrating methods of fabricating semiconductor integrated circuit devices according to some embodiments of the present disclosure.

As shown in FIGS. 5A and 7, a stacked transistor structure 105 including a first channel pattern of a first transistor 101 and a second channel pattern of a second transistor 102 stacked on the first channel pattern is provided directly on a substrate 110 (block 702). In particular, as shown in FIG. 5A, a layer stack including alternating gate layers and channel layers is formed directly on a substrate 110, free of buried oxide layers or punch through stopper ion implanted regions therebetween. The layer stack is patterned to form a stacked transistor structure 105 including alternating gate patterns 104 and channel patterns 111, 112 on the substrate 110. Gate insulating patterns 106 and inner spacers 108 may be formed along side surfaces of the gate patterns 104 and channel patterns 111, 112. The inner spacers 108 may be formed of a low-k material (e.g., a nitride, such as SiOCN) or other insulating material. The gate insulating patterns 106 may be formed of an insulating material (e.g., SiN) different than that of the inner spacers 108.

Still referring to FIG. 5A, the substrate 110 is recessed adjacent the opposing sides 113 of the first channel patterns 111 to form recessed surfaces 110R or recesses (relative to the surfaces of the substrate 110 having the stacked transistor structures 105 thereon), and an insulating layer 120L is formed in the recesses 110R. For example, the substrate 110 may be etched (e.g., during the patterning of the alternating gate layers and channel layers) to form the recesses 110R, and the recesses 110R may be filled with an insulating layer 120L (e.g., silicon oxide). In some embodiments, a spin on glass (SOG) and high A/R polysilicon (HARP) etching and deposition process may be performed to form the insulating layer in the recesses 110R, and a chemical mechanical polishing (CMP) process may be performed to form the insulating layer with a substantially planar surface opposite the substrate 110. As shown in FIG. 5B, the insulating layer 120L is recessed to expose opposing sides of the second (upper) channel patterns.

As shown in FIGS. 5C and 7, second source/drain regions 122 of the second transistor 102 are formed on the opposing sides 114 of the second channel patterns 112 (block 704). The second source/drain regions 122 may include a second semiconductor material that is different from a first semiconductor material of the second channel patterns 112. For example, the second channel patterns 112 may be silicon (Si), while the second source/drain regions 122 may be silicon germanium (SiGe). In some embodiments, the second source/drain regions 122 may be formed by selective epitaxial growth at the opposing sides 114 of the second channel patterns 112. That is, forming the second source/drain regions 122 may include epitaxially growing the second source/drain regions 122 of the second transistor 102 on the opposing sides 114 of the second channel patterns 112 while the insulating layer 120L remains on the opposing sides 113 of the first channel patterns 111 (thereby preventing growth thereon without additional fabrication steps for forming and subsequently removing blocking spacers). The upper and lower surfaces 122U and 122L of the second source/drain regions 122 may include portions 122X of the first semiconductor material thereon. In FIG. 5D, the insulating layer 120L may be further recessed to expose side surfaces 111S of the first (lower) channel patterns.

As shown in FIGS. 5E and 7, an oxidation process is performed to oxidize upper and lower surfaces 122U and 122L of the second source/drain regions 122 (block 706). The oxidation process may be, for example, plasma oxidation or thermal oxidation. The oxidized upper and lower surfaces 122U and 122L of the second source/drain regions 122 form first isolation patterns 115. In some embodiments, the upper and lower surfaces 122U and 122L of the second source/drain regions 122 may not be fully oxidized, such that non-oxidized portions 122X of the first semiconductor material (e.g., silicon) may remain between the upper and lower surfaces 122U and 122L of the second source/drain regions 122 and the oxidized portions thereof that provide the first isolation patterns 115. For example, responsive to performing the oxidation process, the upper 122U and/or lower surfaces 122L of the second source/drain regions 122 may include a silicon sub layer 122X and a silicon oxide sub layer 115 on the silicon sub layer 122X. In addition, the side surfaces 111S of the first channel patterns 111 (which were exposed by recessing the insulating layer 120L in FIG. 5D) are oxidized during the oxidation process (block 706).

As shown in FIGS. 5F and 7, insulating patterns 120a are formed on the substrate 110 adjacent the opposing sides of the first channel pattern to provide leakage protection regions 120 (block 706). In the example of FIG. 5F, the insulating patterns 120a of the leakage protection regions 120 are formed by further removing or recessing or otherwise reducing a thickness of the insulating layer 120L. In addition, the oxidized side surfaces 111S of the first channel pattern are removed in FIG. 5F, such that opposing sides or ends of the first channel patterns 111 are recessed relative to the gate insulating patterns 106 on side surfaces of the gate patterns 104. For example, a pre-cleaning operation may be performed to remove the oxidized side surfaces 111S of the first channel patterns 111 to expose the opposing ends of the first channel patterns 111. In some embodiments, the pre-cleaning operation may also reduce a thickness of the leakage protection regions 120 on the substrate 110 adjacent the opposing sides 113 of the first channel patterns 111. That is, in some embodiments, the pre-cleaning process to remove the oxidized side surfaces 111S of the first channel patterns 111 can be performed in same step as reducing the thickness of the insulating layer 120L to form the insulating patterns 120a of the leakage protection regions 120.

As shown in FIGS. 5G1 and 7, first source/drain regions 121 of the first transistor 101 are formed on the opposing sides of the first channel pattern (block 708), and between the leakage protection regions 120 on the substrate 110 and the lower surfaces 122L of the second source/drain regions 122 that were oxidized. The first source/drain regions 121 may include a first semiconductor material that is the same as that of the first channel patterns 111. For example, the first channel patterns 111 and the first source/drain regions 121 may be silicon. The first source/drain regions 121 may be formed by selective epitaxial growth at the opposing sides 113 of the first channel patterns 111, from which the oxidized portions were removed in FIG. 5F. That is, forming the first source/drain regions 121 may include epitaxially growing the first source/drain regions 121 of the first transistor 101 on the opposing sides of the first channel pattern after forming the second source/drain regions 122 of the second transistor, without additional fabrication steps for forming and removing blocking spacers on the opposing sides 114 of the second channel patterns 112 to prevent undesired epitaxial growth. Also, by epitaxially growing the first source/drain regions 121 of the same semiconductor material at the opposing ends 113 of the first channel patterns 111, portions of the first channel patterns 111 that were removed when removing the oxidized side surfaces 111S may be re-grown, such that the overall lengths of the first channel patterns 111 are restored or otherwise maintained. As such, the first and second channel patterns 111 and 112 may have the same or substantially similar channel lengths.

As shown in FIGS. 5G2 and 7, in some embodiments, one or more epitaxial blocking liner layers 230 may be optionally formed on the oxidized upper and lower surfaces 122U and 122L of the second source/drain regions 122 that form the first isolation patterns 115 (block 710). The epitaxial blocking liner patterns may be formed of a different insulating material (e.g., a nitride material) than the oxide material of the first isolation patterns 115. The epitaxial blocking liner patterns may further be formed on the upper surfaces 121U of the first source/drain regions 121, and on sidewall portions vertically extending between the first source/drain regions 121 and the second source/drain regions 122, with a same thickness or with a different thickness than on the upper and lower surfaces 122U and 122L of the second source/drain regions 122. In some embodiments, the epitaxial blocking liner layers 230 may have a thickness of about 4 nm or less.

As shown in FIGS. 5H1, 5H2, and 7, second isolation patterns 116 are formed between the oxidized lower surfaces 122L of the second source/drain regions 122 and upper surfaces 121U of the first source/drain regions 121 (block 712), as well as on the oxidized upper surfaces of the second source/drain regions 122. In the example of FIG. 5H1, the oxidized lower surfaces 122L of the second source/drain regions 122 (which form the first isolation patterns 115) and the second isolation patterns 116 collectively define the device isolation patterns 118 that provide electrical isolation between the first and second source/drain regions 121 and 122. In the example of FIG. 5H2, the oxidized lower surfaces 122L of the second source/drain regions 122 (which form the first isolation patterns 115), the epitaxial blocking liner layers 230, and the second isolation patterns 116 collectively define the device isolation patterns 118. In FIG. 5H2, the device isolation patterns 118 may provide a multi-layer structure including alternating layers of different materials (e.g., an ONO structure or ONON structure) that provide electrical isolation between the first and second source/drain regions 121 and 122.

FIGS. 6A, 6B, 6C, 6D, 6E, 6F, 6G1, 6G2, 6H1, and 6H2 are schematic cross-sectional views illustrating methods of fabricating semiconductor integrated circuit devices according to further embodiments of the present disclosure. The methods of FIGS. 6A to 6H2 are described below with reference to the flowchart 700 of FIG. 7, As shown in FIGS. 6A and 7, a stacked transistor structure 105 including a first channel pattern of a first transistor 101 and a second channel pattern of a second transistor 102 stacked on the first channel pattern is provided directly on a substrate 110 (block 702), free of buried oxide layers or punch through stopper ion implanted regions therebetween. In particular, as similarly described above with reference to FIG. 5A, a stacked structure including alternating gate layers and channel layers is formed directly on a substrate 110, the stacked structure is patterned to form a stacked transistor structure 105 including alternating gate patterns 104 and channel patterns 111, 112 on the substrate 110, and gate insulating patterns 106 and inner spacers 108 may be formed along side surfaces of the gate patterns 104 and channel patterns 111, 112.

Figure 6B:
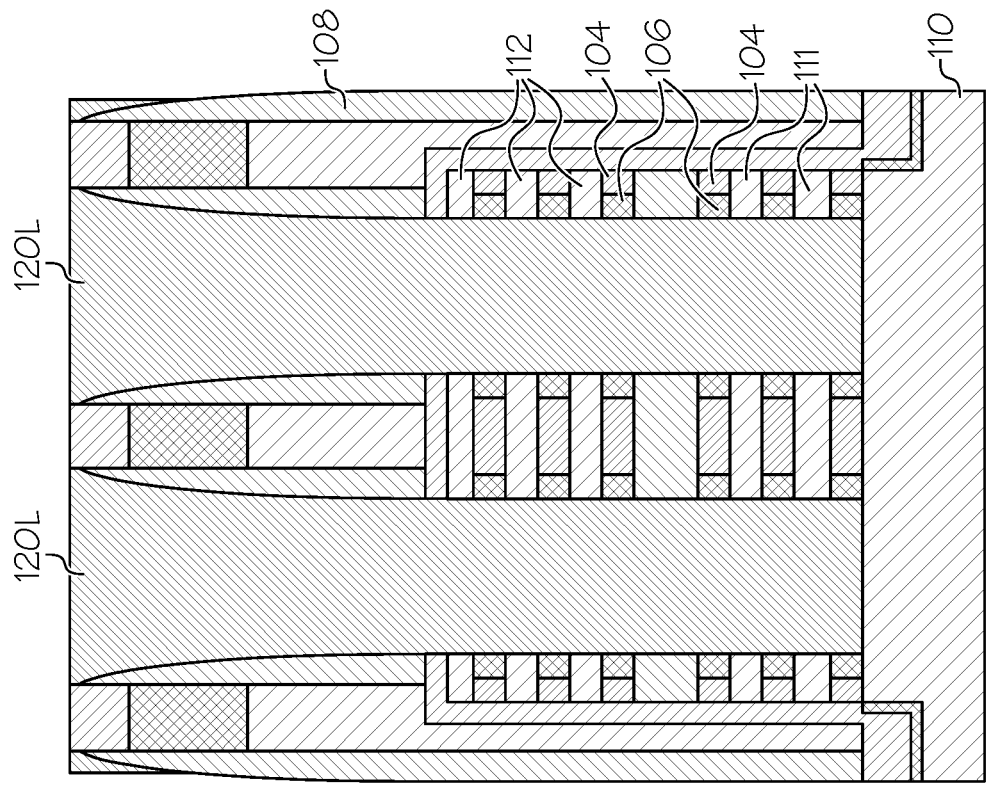

Still referring to FIG. 6A, an insulating layer 120L (e.g., silicon oxide) is formed on surfaces of the substrate 110 at opposing sides of the stacked transistor structure 105, for example, using a SOG and HARP deposition process. The surfaces of the substrate 110 including the insulating layer 120L thereon may be coplanar with the surface of the substrate 110 including the stacked transistor structure 105. That is, in contrast to the example of FIG. 5A, the substrate 110 may not be recessed prior to forming the insulating layer 120L thereon. A CMP process may be performed to form the insulating layer 120L with a substantially planar surface opposite the substrate 110. As shown in FIG. 6B, the insulating layer 120L is recessed to expose opposing sides of the second (upper) channel patterns.

Figure 6D:
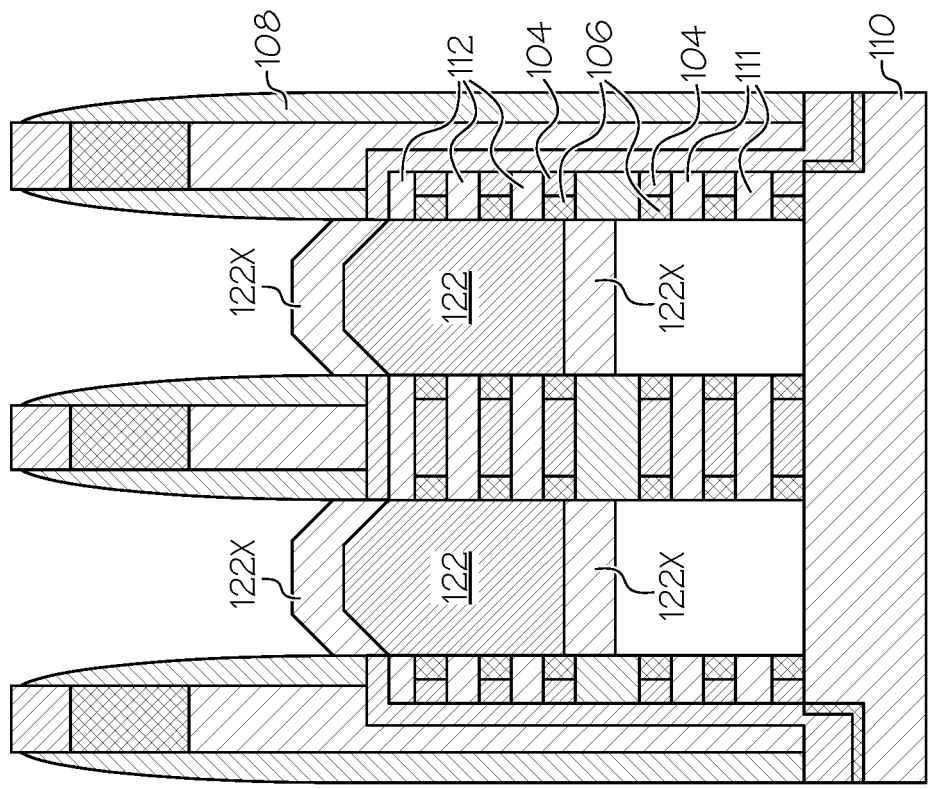
Figure 6C:
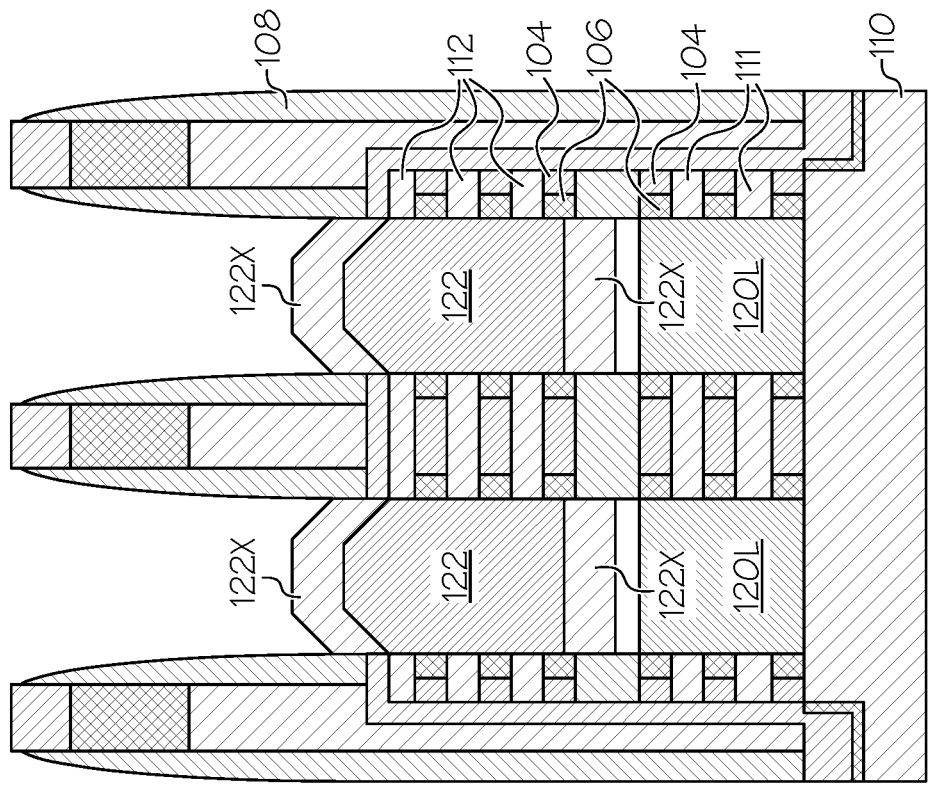

As shown in FIGS. 6C and 7, second source/drain regions 122 of the second transistor 102 are formed on the opposing sides 114 of the second channel patterns 112 (block 704), in a manner similar to that described above with reference to FIG. 5C. As such, the second source/drain regions 122 may include a second semiconductor material (e.g., SiGe) that is different from a first semiconductor material of the second channel patterns 112 (e.g., Si). The second source/drain regions 122 may be formed by selective epitaxial growth at the opposing sides 114 of the second channel patterns 112 while the insulating layer 120L remains on the opposing sides 113 of the first channel patterns 111, thereby preventing growth thereon without additional fabrication steps for forming and subsequently removing blocking spacers. The upper and lower surfaces 122U and 122L of the second source/drain regions 122 may include portions of the first semiconductor material thereon.

In FIG. 6D, the insulating layer 120L may be removed to expose sides surfaces 111S of the first (lower) channel patterns, and to expose the surfaces of the substrate 110 at opposing sides of the stacked transistor structure 105. For example, a SOG strip process may be performed to remove the insulating layer 120L at the side surfaces 111S of the first channel patterns 111 and at the surfaces of the substrate 110 therebetween.

As shown in FIGS. 6E and 7, an oxidation process (e.g., plasma or thermal oxidation) is performed to oxidize upper and lower surfaces 122U and 122L of the second source/drain regions 122 (block 706). As similarly discussed above with reference to FIG. 5E, the oxidized upper and lower surfaces 122U and 122L of the second source/drain regions 122 form first isolation patterns 115. Likewise, as discussed above, the upper and lower surfaces 122U and 122L of the second source/drain regions 122 may not be fully oxidized, such that non-oxidized portions of the first semiconductor material (e.g., silicon) may remain.

In addition, the side surfaces 111S of the first channel patterns 111 and the surfaces of the substrate 110 adjacent or between the opposing sides 113 of the first channel patterns 111 (which were exposed by removing the insulating layer 120L in FIG. 6D) are oxidized during the oxidation process (block 706). That is, the surfaces of the substrate 110 adjacent the opposing sides of the first channel pattern may be oxidized during the same oxidation process used to form the oxidized upper and lower surfaces 122U and 122L of the second source/drain regions 122 to provide the first isolation patterns 115.

As shown in FIGS. 6F and 7, the oxidized surfaces of the substrate 110 are reduced in thickness to form insulating patterns 320a (i.e., oxide patterns) on the substrate 110 adjacent the opposing sides of the first channel pattern to provide leakage protection regions 320 (block 706). The oxidized side surfaces 111S of the first channel pattern are also removed, such that the opposing sides or ends of the first channel patterns 111 are recessed relative to the gate insulating patterns 106 on side surfaces of the gate patterns 104. For example, a pre-cleaning process may be performed to remove the oxidized side surfaces 111S of the first channel patterns 111 and/or to reduce the thickness of the oxidized surfaces of the substrate 110 adjacent the opposing sides 113 of the first channel patterns 111.

As such, in contrast to forming the leakage protection regions by recessing the substrate 110 and forming an insulating layer 120L on the recessed surfaces 110R of the substrate 110 (as in the examples of FIGS. 5A to 5H2), the insulating patterns 320a of the leakage protection regions 320 may be formed on surfaces of the substrate 110 adjacent the opposing sides of the first channel pattern, without recessing the substrate 110 and in the same oxidation process (block 706) used to form the first isolation patterns 115 on the upper and lower surfaces 122U and 122L of the second source/drain regions 122.

As shown in FIGS. 6G1 and 7, first source/drain regions 121 of the first transistor 101 are formed on the opposing sides of the first channel pattern (block 708) between the oxide patterns 320a of the leakage protection regions 320 and the oxidized lower surfaces 122L of the second source/drain regions 122. The first source/drain regions 121 may include a first semiconductor material (e.g., Si) that is the same as that of the first channel patterns 111. The first source/drain regions 121 may be formed by selective epitaxial growth at the opposing sides 113 of the first channel patterns 111 (from which the oxidized portions were removed in FIG. 6F), without additional fabrication steps for forming and removing blocking spacers on the opposing sides 114 of the second channel patterns 112 to prevent undesired epitaxial growth, and such that the first and second channel patterns 111 and 112 may have the same or substantially similar channel lengths (by re-growing the portions of the first channel patterns 111 that were removed in FIG. 6F).

As shown in FIGS. 6G2 and 7, in some embodiments, one or more epitaxial blocking liner layers 230 of a different insulating material (e.g., a nitride material) may be optionally formed on the oxidized upper and lower surfaces 122U and 122L of the second source/drain regions 122 (block 710), as well as on the upper surfaces 121U of the first source/drain regions 121, and on sidewall portions vertically extending between the first source/drain regions 121 and the second source/drain regions 122, as similarly described above with reference to FIG. 5G2.

As shown in FIGS. 6H1, 6H2, and 7, second isolation patterns 116 are formed between the oxidized lower surfaces 122L of the second source/drain regions 122 and upper surfaces 121U of the first source/drain regions 121 (block 712), as well as on upper surfaces 122U of the second source/drain regions 122. In the example of FIG. 6H1, the first isolation patterns 115 and the second isolation patterns 116 collectively define the device isolation patterns 118 that provide electrical isolation between the first and second source/drain regions 121 and 122. In the example of FIG. 6H2, the first isolation patterns 115, the epitaxial blocking liner layers 230, and the second isolation patterns 116 collectively define the device isolation patterns 118 with a multi-layer structure including alternating layers of different materials (e.g., an ONO structure or ONON structure).

Advantages of structures, features, or operations for using oxidation processes disclosed herein may include, for example, fabrication of upper and lower transistors in a stacked transistor structure while omitting formation of blocking spacer layers, which may typically be used in CMOS implementation methods with small CPP. Also, an epi blocking liner (e.g., an SiN liner) of top and bottom devices can optionally use the same thickness. The epi blocking liner may provide further separation and electrical isolation between the upper and lower transistors in the stacked transistor structure. In some embodiments, the epi blocking liner may have a thickness of about 4 nm or less, which may be sufficient to provide electrical isolation between the upper and lower transistors without substantially increasing unintended or undesired capacitance. That is, the epi blocking liner may be formed as thin as possible to provide sufficient electrical isolation between the upper and lower source/drain regions while minimizing increased capacitance. However, embodiments of the present disclosure are not limited thereto.

Some conventional devices may form a bottom device through inner spacer blocking of a top device, and then forming a top device. However, due to the inner spacer formation, the channel length of the top and bottom device may be different. Also, some conventional devices may isolate top and bottom transistor structures through SD EPI oxidation when forming CMOS in CFET, but may not provide leakage protection as described herein. Rather, such conventional devices may be formed on substrates including punch through stopper ion implantation (PTS IIP) or buried oxide (BOX) layers, in contrast to the operations for forming the stacked transistor structure including the channel patterns and gate patterns directly on a surface of the substrate, and subsequently providing leakage protection areas on surfaces of the substrate between adjacent channel pattern stacks as described herein. Thus, embodiments of the present disclosure may address or overcome limitations relating to blocking spacer formation, top and bottom isolation implementation methods in small CPP, and/or unequal channel lengths between upper and lower transistor structures, while reducing or minimizing leakage current.

Embodiments of the present disclosure may thereby provide methods for fabricating 3D stacked transistor structures with improved isolation between the upper and lower transistors by performing one or more oxidation processes (plasma or thermal) as described herein. The oxidation process(es) may oxidize the upper transistor S/D regions (to form first isolation patterns, which may include epitaxial blocking patterns thereon); the sides of the lower transistor channel regions (for subsequent removal and regrowth during formation of the lower S/D regions); and in some embodiments, surfaces of the substrate at the base of the stacked transistor structures (to form leakage protection regions). This may allow first isolation patterns to be formed on the underside of the upper S/D regions before forming the lower S/D regions, while forming the upper and lower transistor channel regions with the same channel lengths, and eliminating fabrication process steps to form blocking spacers.

Unless otherwise defined, all terms used herein have the same meaning as commonly understood by one of ordinary skill in the art. Further, all terms should be interpreted as having a meaning that is consistent with their meaning in the context of the relevant art and this disclosure and will not be interpreted in an idealized or overly formal sense unless expressly so defined herein.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure.

The terminology used herein is for the purpose of describing particular embodiments only and is not intended to be limiting of embodiments. The singular forms "a," "an," and "the" are intended to include the plural forms as well, unless the context clearly indicates otherwise. The terms "comprises," "comprising," "includes" and/or "including" specify the presence of stated features, steps, operations, elements and/or components, but do not preclude the presence or addition of one or more other features, steps, operations, elements, components and/or groups thereof.

It will be understood that, although the terms "first," "second," etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Spatially relative terms such as "below" or "above" or "upper" or "lower" or "top" or "bottom" may be used herein to describe a relationship of one element, layer or region to another element, layer or region based on a frame of reference (e.g., a substrate), as illustrated in the figures. It will be understood that these terms are intended to encompass different orientations of the device in addition to the orientation depicted in the figures.

Example embodiments are described herein with reference to the accompanying drawings, which may include cross-section illustrations that are schematic illustrations of idealized embodiments (and intermediate structures). Many different forms and embodiments are possible without deviating from the teachings of this disclosure. Accordingly, the disclosure should not be construed as limited to the example embodiments set forth herein. As such, it will be understood by those of ordinary skill in the art that various changes in form and details may be made therein without departing from the spirit and scope as defined herein. In the drawings, the sizes and relative sizes of layers and regions may be exaggerated for clarity. Additionally, variations from the shapes of the illustrations as a result, for example, of manufacturing techniques and/or tolerances, are to be expected.

Embodiments of the invention are also described with reference to a fabrication operations and flowchart diagrams. It will be appreciated that the steps shown in the fabrication operations and flowchart diagrams need not be performed in the order shown.

The above-disclosed subject matter is to be considered illustrative, and not restrictive, and the appended claims are intended to cover all such modifications, enhancements, and other embodiments, which fall within the scope of the disclosure. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
   providing a stacked transistor structure on a substrate, the stacked transistor structure comprising a first channel pattern of a first transistor and a second channel pattern of a second transistor stacked on the first channel pattern;
   forming second source/drain regions of the second transistor at opposing ends of the second channel pattern;
   after forming the second source/drain regions, performing an oxidation process to oxidize upper and lower surfaces of the second source/drain regions and side surfaces of the first channel pattern, wherein, prior to performing the oxidation process, the side surfaces of the first channel pattern consist of a semiconductor material; and then
   forming first source/drain regions of the first transistor at opposing ends of the first channel pattern.

2. The method of claim 1, further comprising:
   forming leakage protection regions comprising insulating patterns on the substrate adjacent the opposing ends of the first channel pattern,
   wherein the first source drain/regions are formed on the leakage protection regions between the substrate and the second source/drain regions, and wherein the stacked transistor structure is in direct contact with the substrate between the leakage protection regions.

3. The method of claim 2, wherein forming the leakage protection regions comprises:
   recessing the substrate adjacent the opposing ends of the first channel pattern to provide recessed surfaces; and
   forming the insulating patterns on the recessed surfaces of the substrate.

4. The method of claim 3, wherein forming the leakage protection regions comprises:
   forming an insulating layer on the recessed surfaces of the substrate and on the opposing ends of the first channel pattern prior to forming the second source/drain regions; and
   reducing a thickness of the insulating layer after epitaxially growing the second source/drain regions to form the insulating patterns.

5. The method of claim 2, wherein forming the leakage protection regions comprises:
   performing the oxidation process to form the insulating patterns on surfaces of the substrate adjacent the opposing ends of the first channel pattern.

6. The method of claim 1, wherein forming the first source/drain regions comprises:
   removing the side surfaces of the first channel pattern that were oxidized to expose the opposing ends of the first channel pattern, wherein the opposing ends of the first channel pattern are recessed relative to opposing ends of the second channel pattern responsive to the removing; and then
   epitaxially growing the first source/drain regions of the first transistor at the opposing ends of the first channel pattern.

7. The method of claim 1, wherein the lower surfaces of the second source/drain regions that were oxidized provide first isolation patterns, and further comprising:
forming second isolation patterns between the first isolation patterns and upper surfaces of the first source/drain regions,
wherein the first isolation patterns and the second isolation patterns electrically isolate the first source/drain regions from the second source/drain regions.

8. The method of claim 7, further comprising, prior to forming the second isolation patterns:
forming epitaxial blocking liner layers on the upper and lower surfaces of the second source/drain regions that were oxidized,
wherein the first isolation patterns, the epitaxial blocking liner layers on the lower surfaces of the second source/drain regions, and the second isolation patterns electrically isolate the first source/drain regions from the second source/drain regions.

9. The method of claim 1, wherein the first source/drain regions comprise a same material as the first channel pattern, and wherein, responsive to forming the first source/drain regions, the first and second channel patterns have a same channel length.

10. The method of claim 9, wherein the second source/drain regions comprise a different material than the first source/drain regions.

11. The method of claim 10, wherein the first source/drain regions are of a first conductivity type, and the second source/drain regions are of a second conductivity type that is opposite to the first conductivity type.

12. The method of claim 10, wherein the second channel pattern comprises silicon, and responsive to performing the oxidation process, silicon portions are provided between the upper and lower surfaces of the second source/drain regions that were oxidized.

13. The method of claim 1, wherein forming the first and second source drain regions is performed without forming blocking spacers on the opposing ends of the second channel pattern, and wherein the first and second channel patterns have a same channel length.

14. The method of claim 1, wherein the stacked transistor structure comprises the first and second channel patterns and gate patterns that are stacked directly on a portion of the substrate, wherein the portion of the substrate consists of a semiconductor material, and wherein the first source/drain regions are between the second source/drain regions and the portion of the substrate.

15. A method of forming an integrated circuit device, the method comprising:
providing a stacked transistor structure on a substrate, the stacked transistor structure comprising a first channel pattern of a first transistor and a second channel pattern of a second transistor stacked on the first channel pattern;
forming second source/drain regions of the second transistor at opposing ends of the second channel pattern;
forming leakage protection regions comprising insulating patterns on the substrate adjacent the opposing ends of the first channel pattern; and then
forming first source/drain regions of the first transistor at opposing ends of the first channel pattern, wherein the first source/drain regions are between the second source/drain regions and the leakage protection regions,
wherein the stacked transistor structure is in direct contact with a portion of the substrate between the leakage protection regions, and wherein the portion of the substrate consists of a semiconductor material.

16. The method of claim 15, wherein forming the leakage protection regions comprises:
recessing the substrate adjacent the opposing ends of the first channel pattern to provide recessed surfaces;
forming an insulating layer on the recessed surfaces of the substrate and on opposing ends of the first channel pattern prior to forming the second source/drain regions; and
reducing a thickness of the insulating layer to provide the insulating patterns and to expose the opposing ends of the first channel pattern that are between the insulating patterns and the second source/drain regions, after epitaxially growing the second source/drain regions.

17. The method of claim 15, further comprising:
performing an oxidation process to oxidize upper and lower surfaces of the second source/drain regions and side surfaces of the first channel pattern, prior to forming the first source/drain regions,
wherein forming the first source/drain regions comprises:
removing the side surfaces of the first channel pattern that were oxidized to expose the opposing ends of the first channel pattern, wherein the opposing ends of the first channel pattern are recessed relative to opposing ends of the second channel pattern responsive to the removing; and then
epitaxially growing the first source/drain regions of the first transistor at the opposing ends of the first channel pattern.

18. The method of claim 17, wherein forming the leakage protection regions comprises:
performing the oxidation process to form the insulating patterns on surfaces of the substrate adjacent the opposing ends of the first channel pattern.

19. The method of claim 17, wherein the lower surfaces of the second source/drain regions that were oxidized provide first isolation patterns, and further comprising:
forming second isolation patterns between the first isolation patterns and upper surfaces of the first source/drain regions,
wherein the first isolation patterns and the second isolation patterns electrically isolate the first source/drain regions from the second source/drain regions.

20. The method of claim 19, further comprising:
forming epitaxial blocking liner layers on the upper and lower surfaces of the second source/drain regions that were oxidized,
wherein the first isolation patterns, the epitaxial blocking liner layers on the lower surfaces of the second source/drain regions, and the second isolation patterns form device isolation patterns that electrically isolate the first source/drain regions from the second source/drain regions.

* * * * *